(12) United States Patent
Lee et al.

(10) Patent No.: US 11,469,228 B2
(45) Date of Patent: Oct. 11, 2022

(54) SEMICONDUCTOR DEVICE

(71) Applicant: Samsung Electronics Co., Ltd., Suwon-si (KR)

(72) Inventors: Chanwook Lee, Gwangju-si (KR); Seungkwon Kim, Hwaseong-si (KR); Jaechul Kim, Hwaseong-si (KR); Younggun Ko, Seongnam-si (KR); Yuri Masuoka, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 17 days.

(21) Appl. No.: 17/146,938

(22) Filed: Jan. 12, 2021

(65) Prior Publication Data

US 2021/0327877 A1    Oct. 21, 2021

(30) Foreign Application Priority Data

Apr. 20, 2020    (KR) .................. 10-2020-0047713

(51) Int. Cl.
*H01L 27/092* (2006.01)
*H01L 29/08* (2006.01)
(Continued)

(52) U.S. Cl.
CPC .... *H01L 27/0924* (2013.01); *H01L 21/28518* (2013.01); *H01L 21/823814* (2013.01);
(Continued)

(58) Field of Classification Search
CPC ....... H01L 21/28518; H01L 21/823431; H01L 21/823814; H01L 21/823821; H01L 21/823871; H01L 21/845; H01L 27/0886; H01L 27/0924; H01L 27/10879; H01L 27/1211; H01L 29/0843; H01L 29/0847; H01L 29/165; H01L 29/4175; H01L 29/41791; H01L 29/45; H01L 29/66545; H01L 29/66795; H01L 29/7848; H01L 29/785; H01L 29/7851; H01L 29/7853; H01L 29/7855; H01L 2029/7858
See application file for complete search history.

(56) References Cited

U.S. PATENT DOCUMENTS 7,394,116 B2    7/2008    Kim et al.
7,888,214 B2    2/2011    Teo et al.
(Continued)

FOREIGN PATENT DOCUMENTS

KR    10-0594282 B1    6/2006
KR    10-2018-0112897 A    10/2018

*Primary Examiner* — David C Spalla
(74) *Attorney, Agent, or Firm* — Muir Patent Law, PLLC

(57) ABSTRACT

Disclosed is a semiconductor device comprising a substrate including PMOSFET and NMOSFET regions, first active fins at the PMOSFET region, second active fins at the NMOSFET region, a gate electrode extending in a first direction and running across the first and second active fins, a first source/drain pattern on the first active fins and connecting the first active fins to each other, a second source/drain pattern on the second active fins and connecting the second active fins to each other, a first active contact electrically connected to the first source/drain pattern, and a second active contact electrically connected to the second source/drain pattern. A maximum width of the first active contact in the first direction is less than a maximum width of the second active in the first direction.

19 Claims, 25 Drawing Sheets

(51) Int. Cl.
  *H01L 29/165*   (2006.01)
  *H01L 29/417*   (2006.01)
  *H01L 29/45*    (2006.01)
  *H01L 29/78*    (2006.01)
  *H01L 21/285*   (2006.01)
  *H01L 21/8238*  (2006.01)
  *H01L 29/66*    (2006.01)

(52) U.S. Cl.
  CPC ........ *H01L 21/823821* (2013.01); *H01L 21/823871* (2013.01); *H01L 29/0847* (2013.01); *H01L 29/165* (2013.01); *H01L 29/41791* (2013.01); *H01L 29/45* (2013.01); *H01L 29/66545* (2013.01); *H01L 29/66795* (2013.01); *H01L 29/7848* (2013.01); *H01L 29/7851* (2013.01)

(56) References Cited

U.S. PATENT DOCUMENTS

| | | |
|---|---|---|
| 8,384,161 B2 | 2/2013 | Richter et al. |
| 8,541,885 B2 | 9/2013 | Gerhardt et al. |
| 9,196,528 B2 | 11/2015 | Ellis-Monaghan et al. |
| 9,196,613 B2 | 11/2015 | Basker et al. |
| 9,875,332 B2 | 1/2018 | Yeric |
| 10,128,245 B2 | 11/2018 | Lee et al. |
| 2006/0131662 A1 | 6/2006 | Yamada et al. |
| 2016/0086950 A1* | 3/2016 | Eom ............... H01L 21/76897 257/192 |
| 2018/0090495 A1* | 3/2018 | Lee ............... H01L 21/823828 |
| 2019/0287969 A1 | 9/2019 | Choi et al. |
| 2020/0058651 A1* | 2/2020 | Liaw ............... H01L 27/0924 |

* cited by examiner

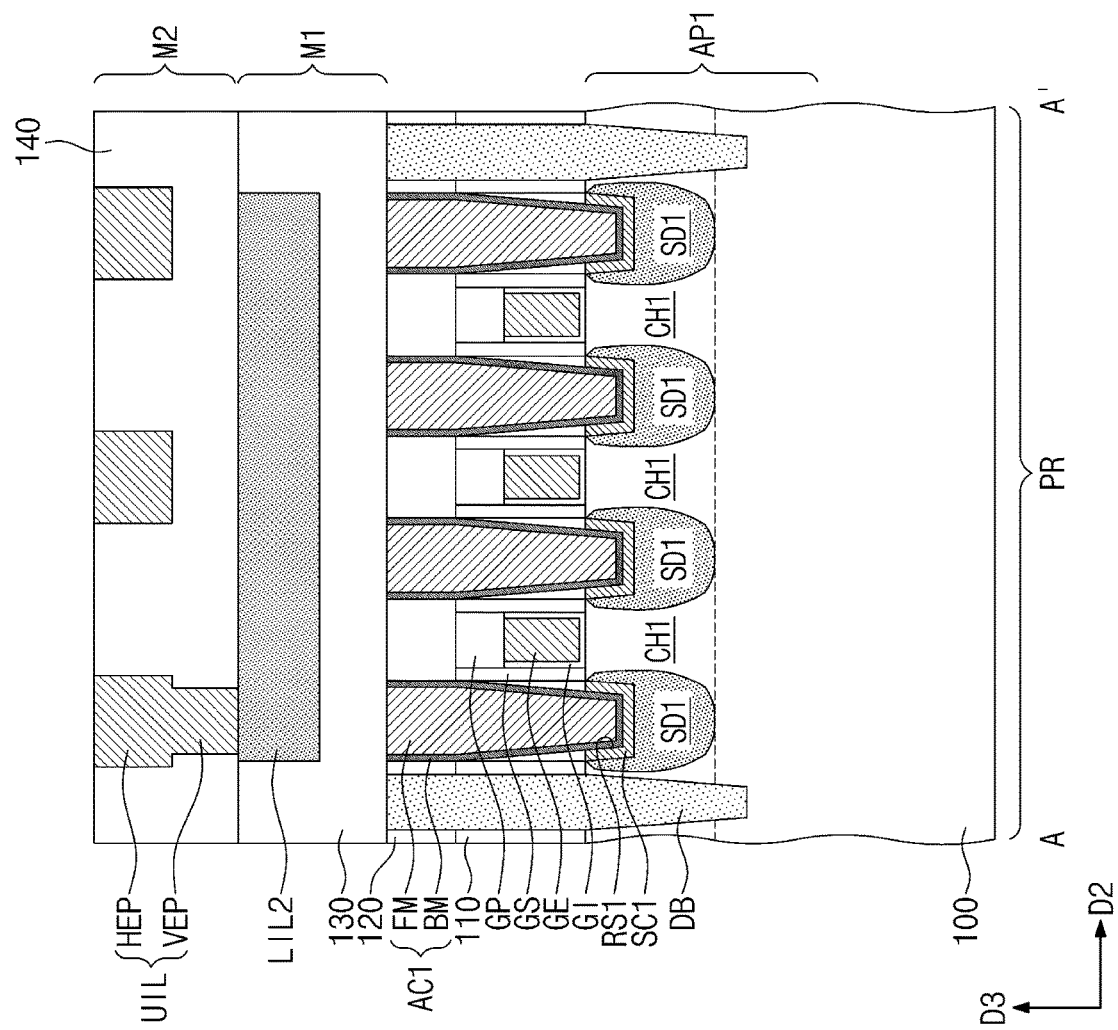

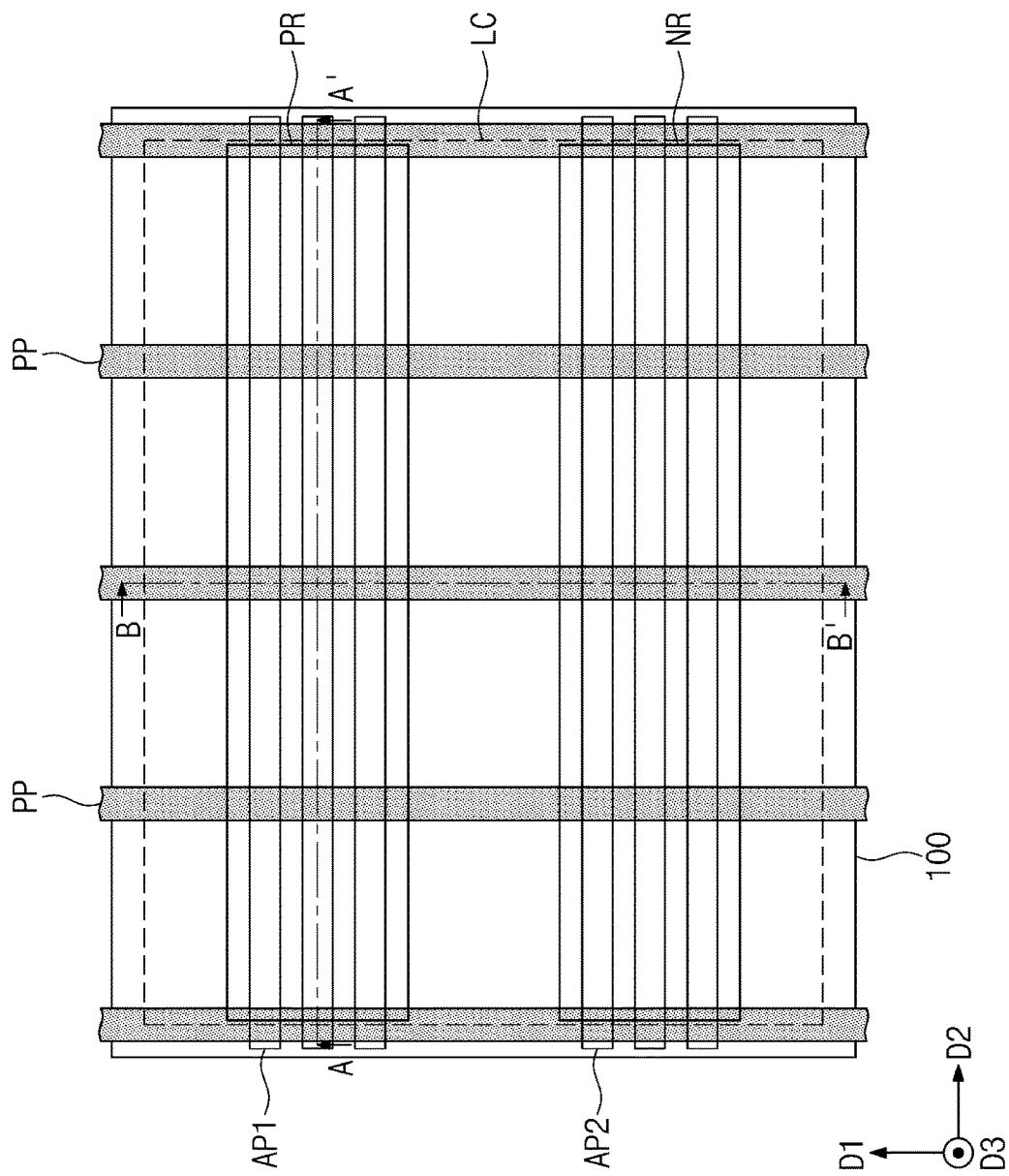

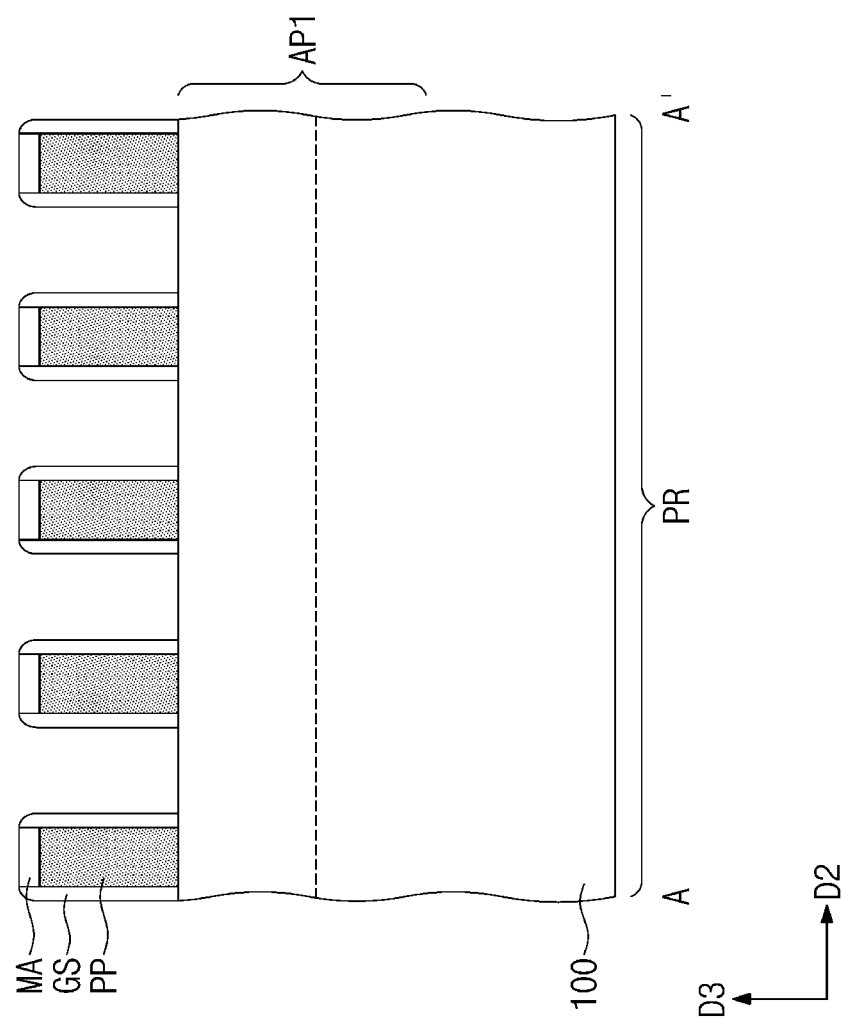

SEMICONDUCTOR DEVICE

CROSS-REFERENCE TO RELATED APPLICATION

This U.S. nonprovisional application claims priority under 35 U.S.C § 119 to Korean Patent Application No. 10-2020-0047713 filed on Apr. 20, 2020 in the Korean Intellectual Property Office, the disclosure of which is hereby incorporated by reference in its entirety.

BACKGROUND

The present inventive concepts relate to a semiconductor device, and more particularly, to a semiconductor device including an electric field effect transistor.

A semiconductor device includes an integrated circuit including metal oxide semiconductor field effect transistors (MOSFETs). As sizes and design rules of the semiconductor device are gradually decreased, sizes of the MOSFETs are also increasingly scaled down. The scale down of MOSFETs may deteriorate operating characteristics of the semiconductor device. Accordingly, various research has been conducted to develop methods of fabricating semiconductor devices having superior performance while overcoming issues associated with high integration of the semiconductor devices.

SUMMARY

Some example embodiments of the present inventive concepts provide a semiconductor device with improved electrical characteristics.

According to some example embodiments of the present inventive concepts, a semiconductor device may comprise: a substrate that includes a PMOSFET region and an NMOSFET region; a plurality of first active fins at the PMOSFET region; a plurality of second active fins at the NMOSFET region; a gate electrode that extends in a first direction and runs across the first active fins and the second active fins; a first source/drain pattern on the first active fins, the first source/drain pattern connecting the first active fins to each other; a second source/drain pattern on the second active fins, the second source/drain pattern connecting the second active fins to each other; a first active contact electrically connected to the first source/drain pattern; and a second active contact electrically connected to the second source/drain pattern. A maximum width of the first active contact in the first direction is less than a maximum width of the second active contact in the first direction.

According to some example embodiments of the present inventive concepts, a semiconductor device may comprise: a PMOSFET region and an NMOSFET region that are spaced apart from each other in a first direction on a substrate; a first active pattern and a second active pattern that are respectively provided on the PMOSFET region and the NMOSFET region; a first source/drain pattern and a second source/drain pattern that are respectively provided on the first active pattern and the second active pattern; and a first active contact and a second active contact that are respectively electrically connected to the first source/drain pattern and the second source/drain pattern. A maximum width of the first active contact in the first direction is less than a maximum width of the second active contact in the first direction. A ratio of the maximum width of the first active contact in the first direction to the maximum width of the second active contact in the first direction is greater than about 1:4. A lowermost portion of the first active contact may be located at a first level. A lowermost portion of the second active contact may be located at a second level. The first level may be higher than the second level.

According to some example embodiments of the present inventive concepts, a semiconductor device may comprise: a logic cell on a substrate, the logic cell including a PMOSFET region and an NMOSFET region that are spaced apart from each other in a first direction; a device isolation layer that defines a plurality of first active fins at the PMOSFET region and a plurality of second active fins at the NMOSFET region, the first and second active fins extending in a second direction that intersects the first direction; a first source/drain pattern on the first active fins, the first source/drain pattern connecting the first active fins to each other; a second source/drain pattern on the second active fins, the second source/drain pattern connecting the second active fins to each other; a gate electrode that extends in the first direction and extends across the first active fins and the second active fins; a gate spacer on opposite sides of the gate electrode, the gate spacer extending in the first direction; a gate dielectric pattern between the gate electrode and the first active fin, between the gate electrode and the second active fin, and between the gate electrode and the gate spacer; a gate capping pattern on a top surface of the gate electrode, the gate capping pattern extending in the first direction; an interlayer dielectric layer on the gate electrode, the first source/drain pattern, and the second source/drain pattern; a gate contact in the interlayer dielectric layer and electrically connected to the gate electrode; a first active contact and a second active contact that are disposed in the interlayer dielectric layer and are respectively electrically connected to the first source/drain pattern and the second source/drain pattern; and a first silicide pattern and a second silicide pattern, the first silicide pattern being provided between the first active contact and the first source/drain pattern, and the second silicide pattern being provided between the second active contact and the second source/drain pattern. The number of the first active fins is at least three. A maximum width of the first active contact in the first is less than a maximum width of the second active contact in the first direction. A ratio of the maximum width of the first active contact in the first direction to the maximum width of the second active contact in the first direction is greater than about 1:4.

BRIEF DESCRIPTION OF THE DRAWINGS

FIGS. 2A, 2B, 2C, and 2D illustrate cross-sectional views respectively taken along lines A-A', B-B', C-C', and D-D' of FIG. 1.

FIGS. 6, 8, 10, and 12 illustrate plan views showing a method of fabricating a semiconductor device according to some example embodiments of the present inventive concepts.

FIGS. 7, 9A, 11A, and 13A illustrate cross-sectional views taken along line A-A' of FIGS. 6, 8, 10, and 12, respectively.

DETAILED DESCRIPTION OF EMBODIMENTS

Figure 1:
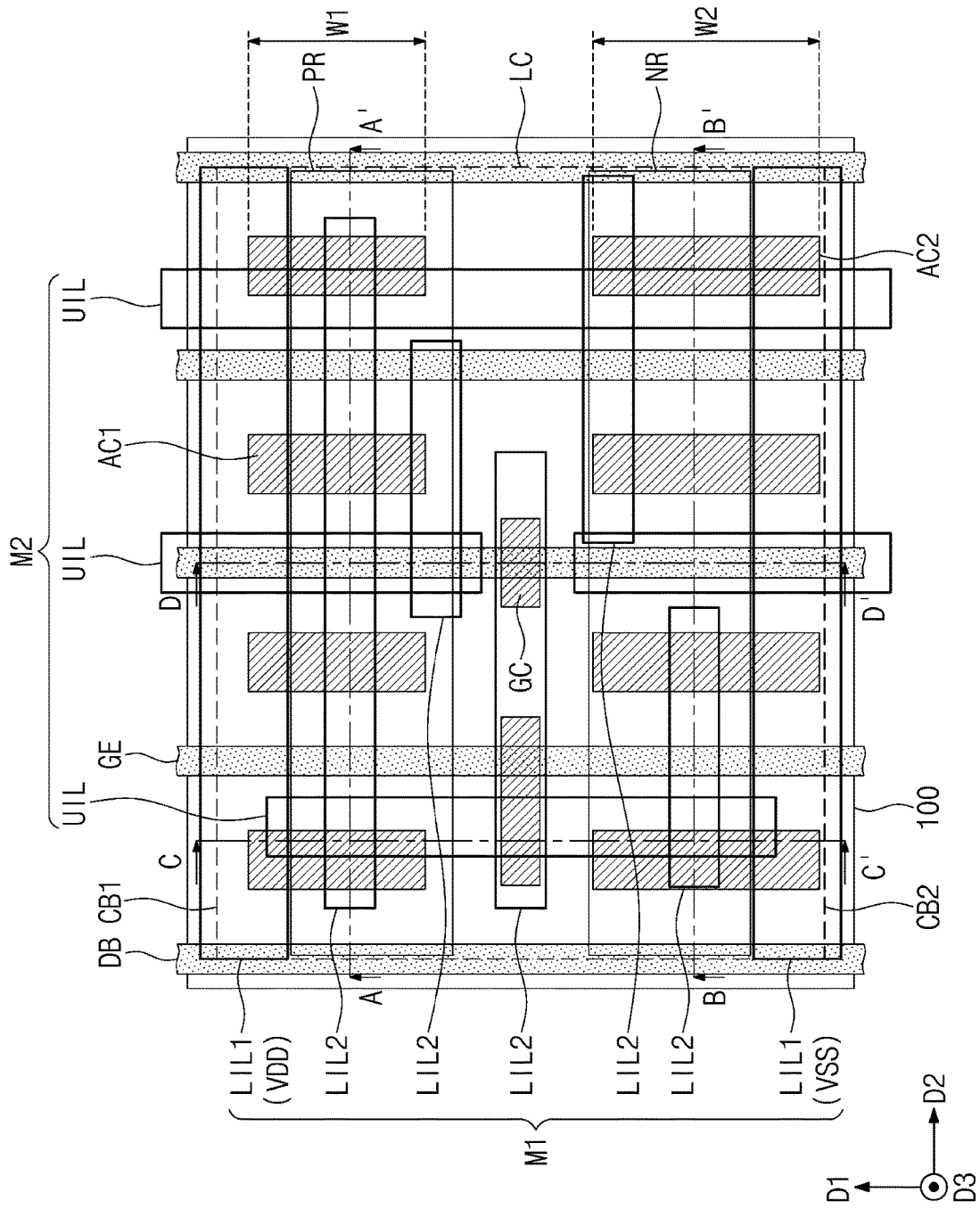
FIG. 1 illustrates a plan view showing a semiconductor device according to some example embodiments of the present inventive concepts.

FIG. 1 illustrates a plan view showing a semiconductor device according to some example embodiments of the present inventive concepts. FIGS. 2A, 2B, 2C, and 2D illustrate cross-sectional views respectively taken along lines A-A', B-B', C-C', and D-D' of FIG. 1.

Referring to FIGS. 1 and 2A to 2D, a logic cell LC may be provided on a substrate 100. In this description, the language "logic cell" may refer to a unit circuit configured to perform a single logical operation and be composed of a plurality of interconnected MOSFETs. Examples of logic cells include a NAND gate, a NOR gate, an inverter, flip-flop, and a latch. In addition, it will be apparent that the invention is not limited to one or a plurality of logic cells, but may be implemented in connection with one or more transistors, a portion of a transistor, wiring lines to connect the transistors to each other, an integrated circuit (e.g., comprising a plurality of interconnected logic cell), a semiconductor chip, a plurality of semiconductor chips (e.g., stacked in a package), etc.

The substrate 100 may include a PMOSFET region PR and an NMOSFET region NR. The substrate 100 may be a compound semiconductor substrate or a semiconductor substrate including silicon (Si), germanium (Ge), silicon-germanium (SiGe), or the like. For example, the substrate 100 may be a silicon substrate.

The PMOSFET and NMOSFET regions PR and NR may be defined by a second trench TR2 formed on an upper portion of the substrate 100. The second trench TR2 may be positioned between the PMOSFET region PR and the NMOSFET region NR. The PMOSFET region PR and the NMOSFET region NR may be spaced apart from each other in a first direction D1 across the second trench TR2. The PMOSFET region PR and the NMOSFET region NR may extend in a second direction D2 that intersects the first direction D1.

First active patterns AP1 and second active patterns AP2 may be respectively provided on the PMOSFET region PR and the NMOSFET region NR. The first and second active patterns AP1 and AP2 may extend parallel to each other in the second direction D2. The first and second active patterns AP1 and AP2 may be portions of the substrate 100 that protrude in a vertical direction (or the third direction D3). A first trench TR1 may be defined between neighboring first active patterns AP1 and between neighboring second active patterns AP2. The first trench TR1 may be shallower than the second trench TR2.

The first active pattern AP1 may include a plurality of active fins that are arranged along the first direction D1. For example, the first active pattern AP1 may include a first active fin AF1, a second active fin AF2, and a third active fin AF3. Likewise, the second active pattern AP2 may include a plurality of active fins that are arranged along the first direction D1. For example, the second active pattern AP2 may include a fourth active fin AF4, a fifth active fin AF5, and a sixth active fin AF6. Although the first active pattern AP1 is illustrated to include three active fins, the first active pattern AP1 may include more than three active fins. This may also hold true for the second active pattern AP2. Fins may be formed on the substrate though etching of the substrate and/or fins may be epitaxially grown on the substrate.

A device isolation layer ST may fill the first and second trenches TR1 and TR2. The device isolation layer ST may include or may be a silicon oxide layer. The first and second active patterns AP1 and AP2 may have upper portions that protrude upwards vertically from the device isolation layer ST (see FIG. 2D). Each of the upper portions of the first and second active patterns AP1 and AP2 may have a fin shape. The device isolation layer ST may cover none of the upper portions of the first and second active patterns AP1 and AP2. The device isolation layer ST may cover lower sidewalls of the first and second active patterns AP1 and AP2.

First source/drain patterns SD1 may be provided on the upper portions of the first active patterns AP1. The first source/drain patterns SD1 may be impurity regions each having a first conductivity type (e.g., p-type). A first channel pattern CH1 may be interposed between a pair of first source/drain patterns SD1. Second source/drain patterns SD2 may be provided on the upper portions of the second active patterns AP2. The second source/drain patterns SD2 may be impurity regions each having a second conductivity type (e.g., n-type). A second channel pattern CH2 may be interposed between a pair of second source/drain patterns SD2.

The first and second source/drain patterns SD1 and SD2 may be epitaxial patterns formed by a selective epitaxial growth process. For example, the first and second source/drain patterns SD1 and SD2 may have their top surfaces coplanar with those of the first and second channel patterns CH1 and CH2. It will be appreciated that "planarization," "co-planar," "planar," etc., as used herein refer to structures (e.g., surfaces) that need not be perfectly geometrically planar, but may include acceptable variances that may result from standard manufacturing processes. For another example, the first and second source/drain patterns SD1 and SD2 may have their top surfaces higher than those of the first and second channel patterns CH1 and CH2.

The first source/drain patterns SD1 may be provided on a plurality of active fins at the PMOSFET region PR, while connecting the plurality of active fins to each other. The second source/drain patterns SD2 may be provided on a plurality of active fins at the NMOSFET region NR, while connecting the plurality of active fins to each other. The first and second source/drain patterns SD1 and SD2 may be merged source/drain patterns.

The first source/drain patterns SD1 may include a semiconductor element whose lattice constant is greater than that of a semiconductor element included in the substrate 100. For example, the first source/drain patterns SD1 may include or may be silicon-germanium (SiGe). Therefore, the first source/drain patterns SD1 may provide the first channel patterns CH1 with compressive stress. For example, the second source/drain patterns SD2 may include or may be the same semiconductor element (e.g., Si) as that of the substrate 100.

Gate electrodes GE may be provided to extend in the first direction D1, while running across the first and second active patterns AP1 and AP2. The gate electrodes GE may be arranged along the second direction D2. The gate electrodes GE may vertically overlap the first and second channel patterns CH1 and CH2. A gate electrode GE may surround a top surface and opposite sidewalls of each of the first and second channel patterns CH1 and CH2.

Referring back to FIG. 2D, a gate electrode GE may be provided on the top surface of the first channel pattern CH1 and on at least one sidewall of the first channel pattern CH1. A gate electrode GE may be provided on the top surface of the second channel pattern CH2 and on at least one sidewall of the second channel pattern CH2. For example, a transistor according to example embodiments may be a three-dimensional field effect transistor (e.g., FinFET) in which a gate electrode GE three-dimensionally surrounds the first and second channel patterns CH1 and CH2.

Referring back to FIGS. 1 and 2A to 2D, a pair of gate spacers GS may be disposed on opposite sidewalls of each of the gate electrodes GE. The gate spacers GS may extend in the first direction D1 along the gate electrodes GE. The gate spacers GS may have their top surfaces coplanar with that of a first interlayer dielectric layer 110 which will be discussed below. The gate spacers GS may include or may be formed of at least one selected from SiCN, SiCON, and SiN. Alternatively, the gate spacers GS may include or may be a multi-layer formed of at least two selected from SiCN, SiCON, and SiN.

A gate capping pattern GP may be provided on each of the gate electrodes GE. The gate capping pattern GP may extend in the first direction D1 along the gate electrode GE. The gate capping pattern GP may include a material having an etch selectivity with respect to first and second interlayer dielectric layers 110 and 120 which will be discussed below. For example, the gate capping pattern GP may include at least one selected from SiON, SiCN, SiCON, and SiN.

A gate dielectric pattern GI may be interposed between the gate electrode GE and the first active pattern AP1 and between the gate electrode GE and the second active pattern AP2. The gate dielectric pattern GI may extend along a bottom surface of the gate electrode GE. For example, the gate dielectric pattern GI may cover the top surface and the opposite sidewalls of the first channel pattern CH1, may cover the top surface and the opposite sidewalls of the second channel pattern CH2, and may cover a top surface of the device isolation layer ST that underlies the gate electrode GE (see FIG. 13D).

In some example embodiments of the present inventive concepts, the gate dielectric pattern GI may include a high-k dielectric material whose dielectric constant is greater than that of a silicon oxide layer. For example, the high-k dielectric material may include at least one selected from hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

The gate electrode GE may include a first metal pattern and a second metal pattern on the first metal pattern. The first metal pattern may be provided on the gate dielectric pattern GI and adjacent to the first and second channel patterns CH1 and CH2. The first metal pattern may include a work-function metal that controls a threshold voltage of a transistor. A thickness and composition of the first metal pattern may be adjusted to achieve a desired threshold voltage.

The first metal pattern may include or may be a metal nitride layer. For example, the first metal pattern may include nitrogen (N) and at least one metal selected from titanium (Ti), tantalum (Ta), aluminum (Al), tungsten (W), and molybdenum (Mo). The first metal pattern may further include carbon (C). The first metal pattern may include a plurality of stacked work-function metal layers.

The second metal pattern may include or may be a metal whose resistance is lower than that of the first metal. For example, the second metal pattern may include at least one metal selected from tungsten (W), aluminum (Al), titanium (Ti), and tantalum (Ta).

A first interlayer dielectric layer 110 may be provided on the substrate 100. The first interlayer dielectric layer 110 may cover the gate spacers GS and the first and second source/drain patterns SD1 and SD2. The first interlayer dielectric layer 110 may have a top surface substantially coplanar with those of the gate capping patterns GP and those of the gate spacers GS.

The first interlayer dielectric layer 110 may be provided thereon with a second interlayer dielectric layer 120 that covers the gate capping patterns GP. A third interlayer dielectric layer 130 may be provided on the second interlayer dielectric layer 120. A fourth interlayer dielectric layer 140 may be provided on the third interlayer dielectric layer 130. For example, the first to fourth interlayer dielectric layers 110 to 140 may include a silicon oxide layer.

The logic cell LC may have opposite sides that face each other in the second direction D2, and a pair of separation structures DB may be provided on the opposite sides of the logic cell LC. The separation structure DB may extend in the first direction D1 parallel to the gate electrodes GE.

The separation structure DB may penetrate the first and second interlayer dielectric layers 110 and 120, and may extend into the first and second active patterns AP1 and AP2. The separation structure DB may penetrate the upper portions of the first and second active patterns AP1 and AP2. The separation structure DB may separate the PMOSFET and NMOSFET regions PR and NR of the logic cell LC from other PMOSFET and NMOSFET regions PR and NR of an adjacent logic cell LC.

First and second active contacts AC1 and AC2 may be provided to penetrate the first and second interlayer dielectric layers 110 and 120 and to respectively have electrical connections with the first and second source/drain patterns SD1 and SD2. The first and second active contacts AC1 and AC2 may be provided between a pair of gate electrodes GE.

The first and second active contacts AC1 and AC2 may each be a self-aligned contact. For example, the gate capping pattern GP and the gate spacer GS may be used to form the first and second active contacts AC1 and AC2 in a self-aligned manner. The first and second active contacts AC1 and AC2 may each cover at least a portion of a sidewall of the gate spacer GS. Although not shown, the first and second active contacts AC1 and AC2 may each cover a portion of the top surface of the gate capping pattern GP.

Referring back to FIG. 2C, a first width W1 may be given as a maximum width in the first direction D1 of the first active contact AC1, and a second width W2 may be given as a maximum width in the first direction D1 of the second active contact AC2. The first width W1 may be less than the second width W2 (W1<W2). A ratio of the first width W1 to the second width W2 may be greater than a ratio of about 1:4. For example, the ratio of the first width W1 to the second width W2 may be greater than a ratio of about 1:4 and less than a ratio of about 1:1. As the first width W1 of the first active contact AC1 is relatively small, the first active contact AC1 and its adjacent gate electrode GE may have reduced parasitic capacitance therebetween. Terms such as "about" or "approximately" may reflect amounts, sizes, orientations, or layouts that vary only in a small relative manner, and/or in a way that does not significantly alter the operation, functionality, or structure of certain elements. For example, "a ratio of about 1:4" may encompass a deviation such as 0%-5%, especially if such deviation maintains the same effect as the listed range.

The first and second active contacts AC1 and AC2 may have their top surfaces coplanar with each other, and the first active contact AC1 may have a vertical length H1 less than a vertical length H2 of the second active contact AC2. For example, the first active contact AC1 may have a thickness in the third direction D3 less than a thickness in the third direction D3 of the second active contact AC2. The first active contact AC1 may have a bottom surface at a higher level than that of a bottom surface of the second active contact AC2. For example, a lowermost portion of the first active contact AC1 may be located at a first level LV1 higher than a second level LV2 at which is located a lowermost portion of the second active contact AC2. The top surfaces of the first and second active contacts AC1 and AC2 may be located at substantially the same level as that of a top surface of the second interlayer dielectric layer 120. Items described as "substantially the same," "substantially equal," or "substantially planar," may be exactly the same, equal, or planar, or may be the same, equal, or planar within acceptable variations that may occur, for example, due to manufacturing processes.

Figure 2B:
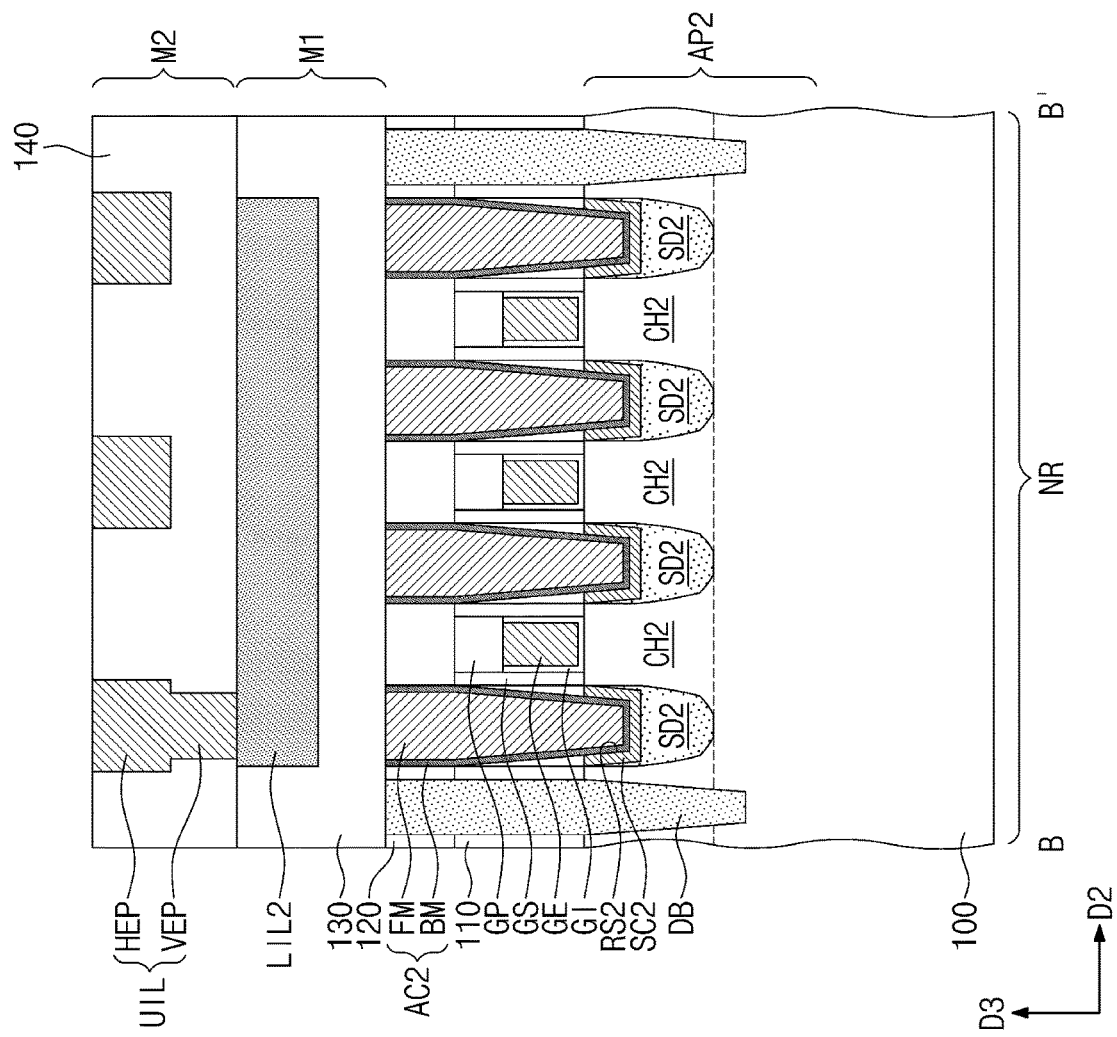
Figure 2C:
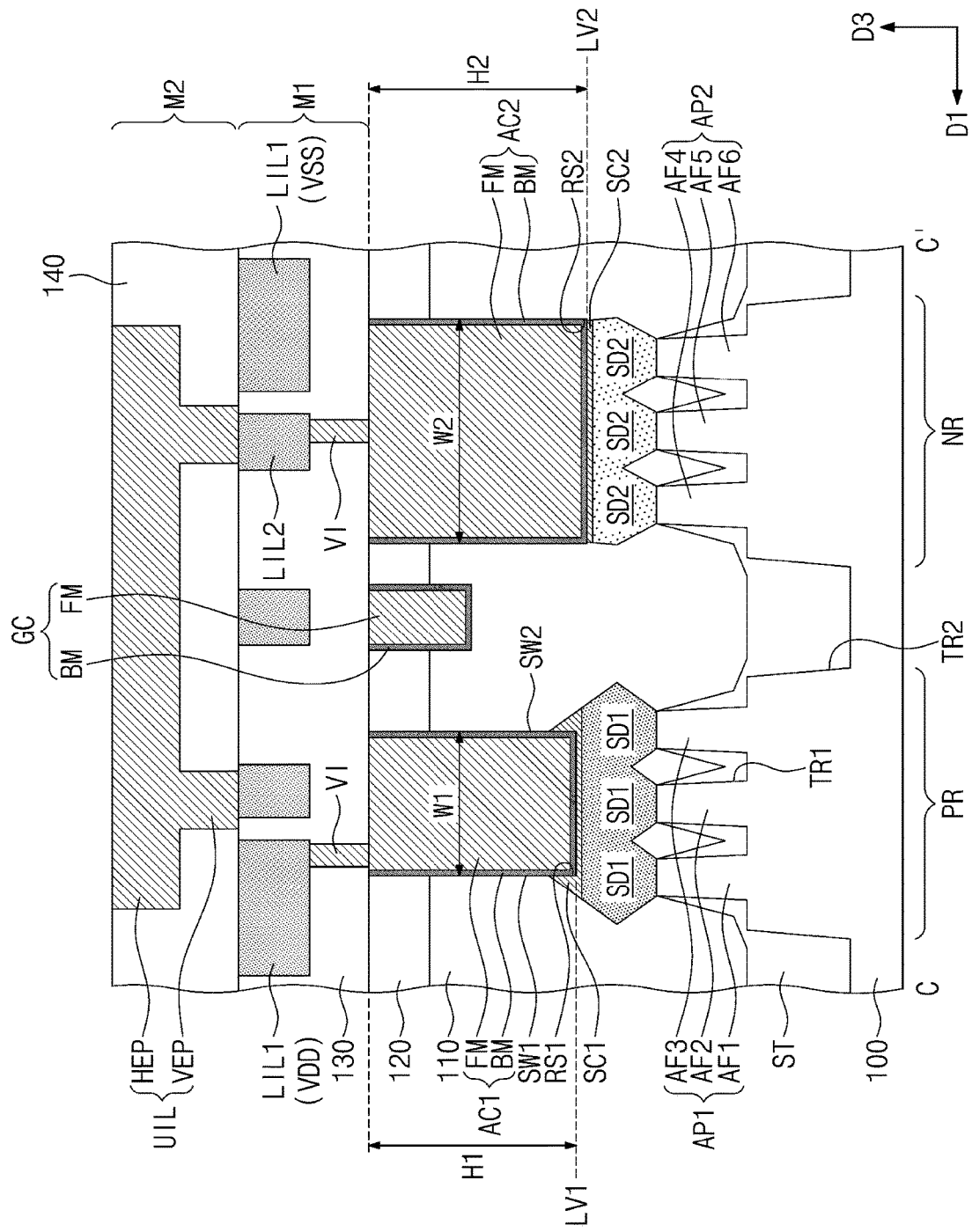
Figure 2D:
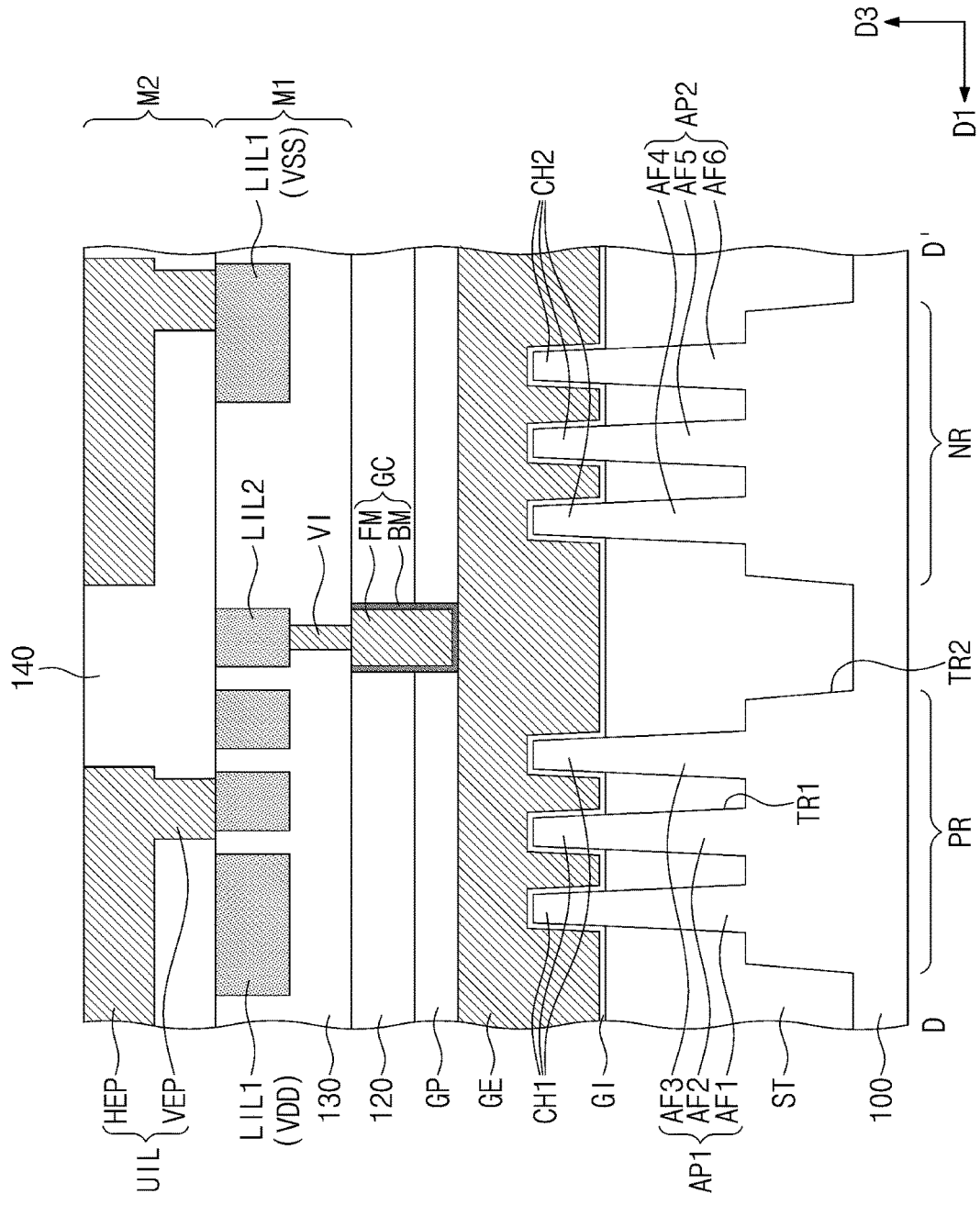

The first and second source/drain patterns SD1 and SD2 may be partially recessed to respectively define first and second recesses RS1 and RS2. The first active contact AC1 may be provided in the first recess RS1 that is formed by recessing the first source/drain pattern SD1. The second active contact AC2 may be provided in the second recess RS2 that is formed by recessing the second source/drain pattern SD2. The first recess RS1 may have a bottom surface at a higher level than that of a bottom surface of the second recess RS2. As shown in FIG. 2C, because the first width W1 is less than the second width W2, and because the vertical length H1 of the first active contact AC1 is less than the vertical length H2 of the second active contact AC2, the first recess RS1 may have a volume less than that of the second recess RS2. For example, a region where the first source/drain pattern SD1 is recessed may have a volume less than that of a region where the second source/drain pattern SD2 is recessed. A volume of the first source/drain pattern SD1 that remains without being recessed may be greater than that of the second source/drain pattern SD2 that remains without being recessed. As the remaining (i.e., non-recessed) first source/drain pattern SD1 has a relatively large volume, the remaining first source/drain pattern SD1 may provide the first channel pattern CH1 with relatively high compressive stress. As a result, the first channel pattern CH1 may decrease in channel resistance.

As the first width W1 of the first active contact AC1 is less than the second width W2 of the second active contact AC2, the first active contact AC1 may increase in contact resistance. That is, the measured ease at which a current can flow across the first active contact AC1 is less than that of the second active contact AC2. However, as a parasitic capacitance and a channel resistance are decreased simultaneously, the increase in contact resistance may be counterbalanced to achieve a semiconductor device with optimized electrical characteristics. In such cases, RC delay may be minimized to enhance performance of the semiconductor device.

A first silicide pattern SC1 may be interposed between the first active contact AC1 and the first source/drain pattern SD1, and a second silicide pattern SC2 may be interposed between the second active contact AC2 and the second source/drain pattern SD2. The first active contact AC1 may be electrically connected through the first silicide pattern SC1 to the first source/drain pattern SD1, and the second active contact AC2 may be electrically connected through the second silicide pattern SC2 to the second source/drain pattern SD2. The first and second silicide patterns SC1 and SC2 may include metal silicide, for example, at least one selected from titanium silicide, tantalum silicide, tungsten silicide, nickel silicide, and cobalt silicide.

The first active contact AC1 may have a first sidewall SW1 and a second sidewall SW2 that face each other in the first direction D1. For example, a portion of the first silicide pattern SC1 may contact one or both of the first and second sidewalls SW1 and SW2 of the first active contact AC1. In such cases, the first silicide pattern SC1 may be in contact with one or both of the sidewalls SW1 and SW2 of the first active contact AC1 and with the bottom surface of the first active contact AC1. As a portion of the first silicide pattern SC1 contact one or both of the first and second sidewalls SW1 and SW2 of the first active contact AC1, the first active contact AC1 may decrease in contact resistance. When an element is referred to as "contacting" or "in contact with" another element, there are no intervening elements present. That, the phrase "contact with," as used herein, refers to a direct connection (i.e., touching) unless the context indicates otherwise.

Referring again to FIGS. 1 and 2A to 2D, a gate contact GC may be provided to penetrate the second interlayer dielectric layer 120 and the gate capping pattern GP and to have an electrical connection with the gate electrode GE. When viewed in plan, the gate contact GC may be disposed between the PMOSFET region PR and the NMOSFET region NR. The gate contact GC may have a bottom surface in contact with a top surface of the gate electrode GE. The gate contact GC may have a top surface coplanar with that of the second interlayer dielectric layer 120. The top surface of the gate contact GC may be coplanar with that of the first active contact AC1 and that of the second active contact AC2.

The gate contact GC may extend in the second direction D2 to have a position between the first active contact AC1 and the second active contact AC2. When viewed in plan, a portion of the gate contact GC may be placed between the first and second active contacts AC1 and AC2, and may be spaced apart in the first direction D1 from the first and second active contacts AC1 and AC2. As the first active contact AC1 has a small thickness in the first direction D1, it may be possible to prevent a short-circuit between the gate contact GC and the first and second active contacts AC1 and AC2 and to increase the degree of freedom of design.

The first active contact AC1, the second active contact AC2, and the gate contact GC may each include a conductive pattern FM and a barrier pattern BM that surrounds the conductive pattern FM. For example, the conductive pattern FM may include at least one metal selected from aluminum, copper, tungsten, molybdenum, and cobalt. The barrier pattern BM may cover sidewalls and a bottom surface of the conductive pattern FM. The barrier pattern BM may include or may be a metal layer and a metal nitride layer. The metal layer may include or may be formed from at least one selected from titanium, tantalum, tungsten, nickel, cobalt, and platinum. The metal nitride layer may include or may be formed from at least one selected from a titanium nitride (TiN) layer, a tantalum nitride (TaN) layer, a tungsten nitride (WN) layer, a nickel nitride (NiN) layer, a cobalt nitride (CoN) layer, and a platinum nitride (PtN) layer.

A first metal layer M1 may be provided in the third interlayer dielectric layer 130. The first metal layer M1 may include first lower wiring lines LIL1, second lower wiring lines LIL2, and lower vias VI. The lower vias VI may be provided below the first and second lower wiring lines LIL1 and LIL2.

The first lower wiring lines LIL1 may run across the logic cell LC, while extending in the second direction D2. The first lower wiring lines LIL1 may be power lines. For example, the first lower wiring line LIL1 may be supplied with a drain voltage VDD or a source voltage VSS.

Referring to FIG. 1, on the logic cell LC, a first cell boundary CB1 may be defined to extend in the second direction D2. On the logic cell LC, a second cell boundary CB2 may be defined on a location opposite to that on which the first cell boundary CB1 is defined. The first cell boundary CB1 may be provided thereon with the first lower wiring line LIL1 to which is applied the drain voltage VDD, or a power voltage. The first lower wiring line LIL1 to which the drain voltage VDD is applied may extend in the second direction D2 along the first cell boundary CB1. The second cell boundary CB2 may be provided thereon with the first lower wiring line LIL1 to which is applied the source voltage VSS, or a ground voltage. The first lower wiring line LIL1 to which the source voltage VS S is applied may extend in the second direction D2 along the second cell boundary CB2.

The second lower wiring lines LIL2 may be disposed between the first lower wiring line LIL1 to which the drain voltage VDD is applied and the first lower wiring line LIL1 to which the source voltage VS S is applied. The second lower wiring lines LIL2 may each have a linear or bar shape.

The lower vias VI may be interposed between the lower wiring lines LIL1 and LIL2 and the active contacts AC1 and AC2. The lower vias VI may be interposed between the second lower wiring lines LIL2 and the gate contacts GC.

A second metal layer M2 may be provided in the fourth interlayer dielectric layer 140. The second metal layer M2 may include upper wiring lines UIL.

The upper wiring lines UIL may extend parallel to each other in the first direction D1. When viewed in plan, the upper wiring lines UIL may each have a linear or bar shape. The upper wiring lines UIL may be arranged along the second direction D2.

A subset of the upper wiring lines UIL may include a line part HEP and a via part VEP. The line part HEP may be provided in an upper portion of the fourth interlayer dielectric layer 140, and may extend in the first direction D1. The via part VEP may be provided in a lower portion of the fourth interlayer dielectric layer 140, and may extend from the line part HEP toward the first metal layer M1 in the third direction D3. For example, the via part VEP may be a via that is interposed between the first metal layer M1 and the line part HEP and connects the first metal layer M1 to the line part HEP.

The line part HEP and the via part VEP may be collectively connected to constitute a single conductor, or one upper wiring line UIL. A dual damascene process may be employed such that the line part HEP and the via part VEP are formed into one upper wiring line UIL.

Figure 3A:
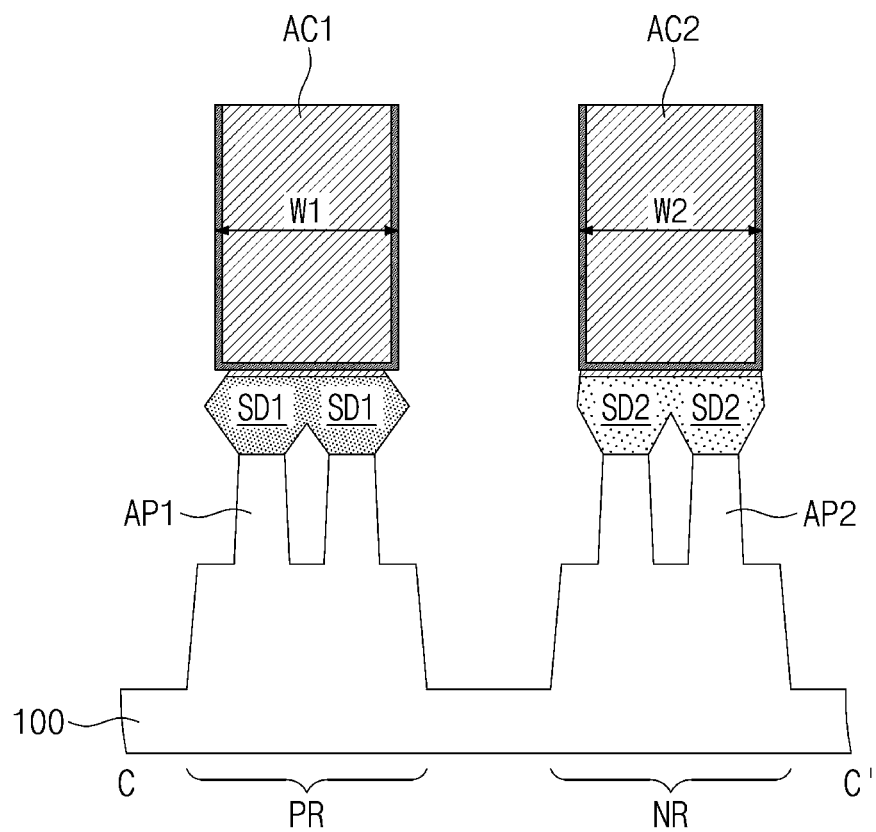
FIGS. 3A and 3B illustrate cross-sectional views taken along line C-C' of FIG. 1, showing a semiconductor device according to comparative examples.
Figure 3B:
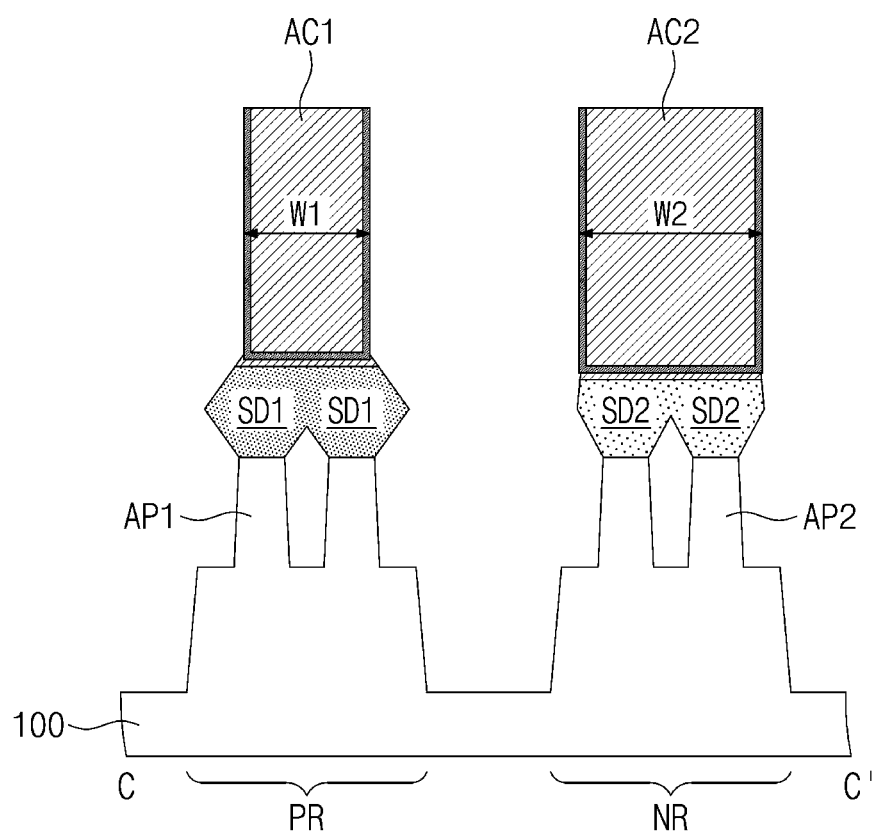
Figure 4A:
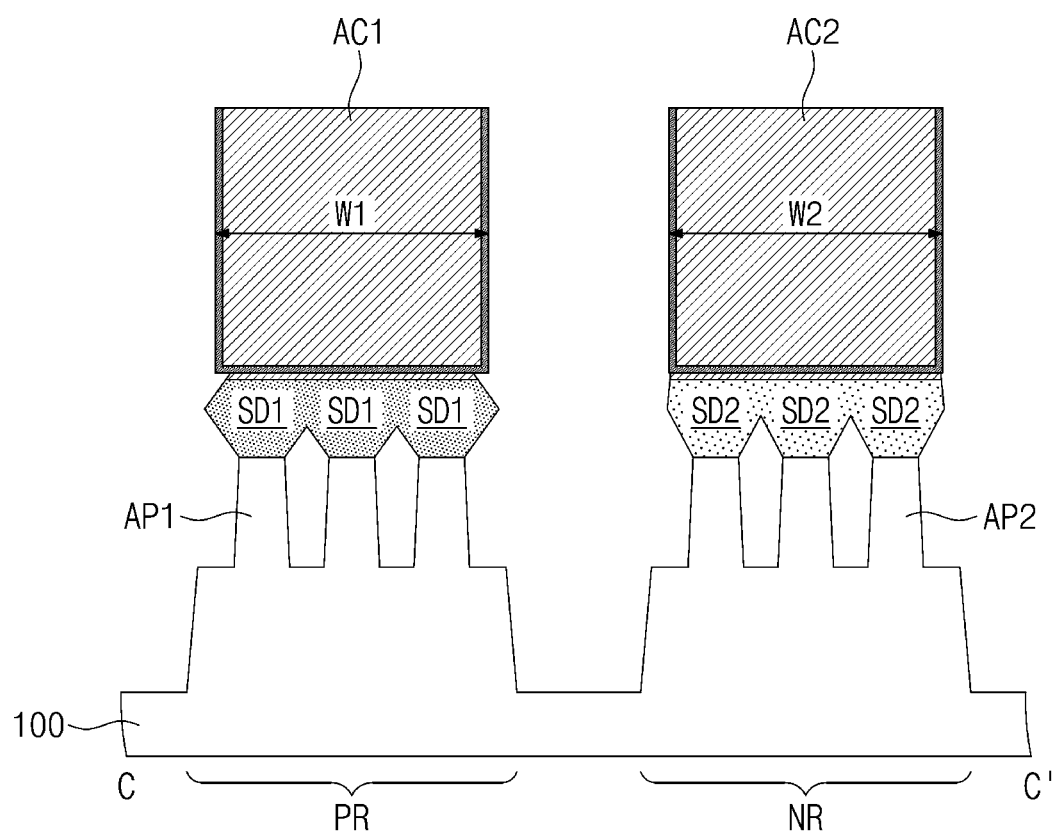
FIGS. 4A and 4B illustrate cross-sectional views taken along line C-C' of FIG. 1, showing a semiconductor device according to some example embodiments of the present inventive concepts.
Figure 4B:
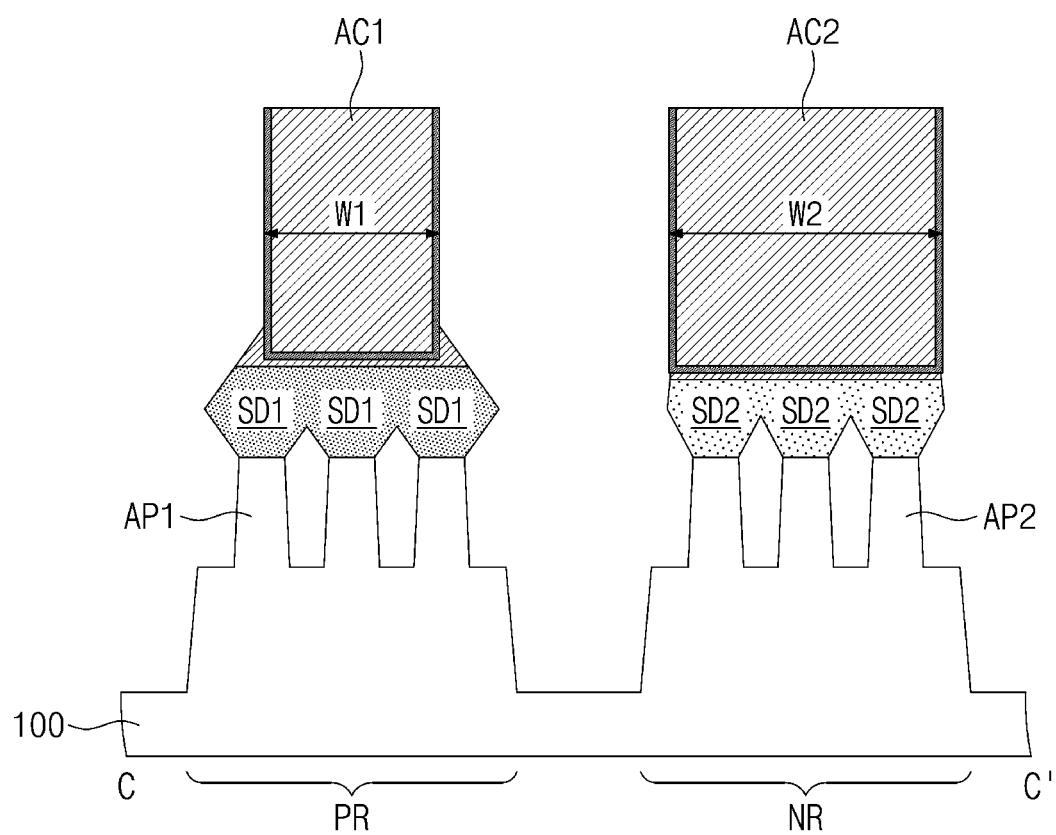
Figure 5:
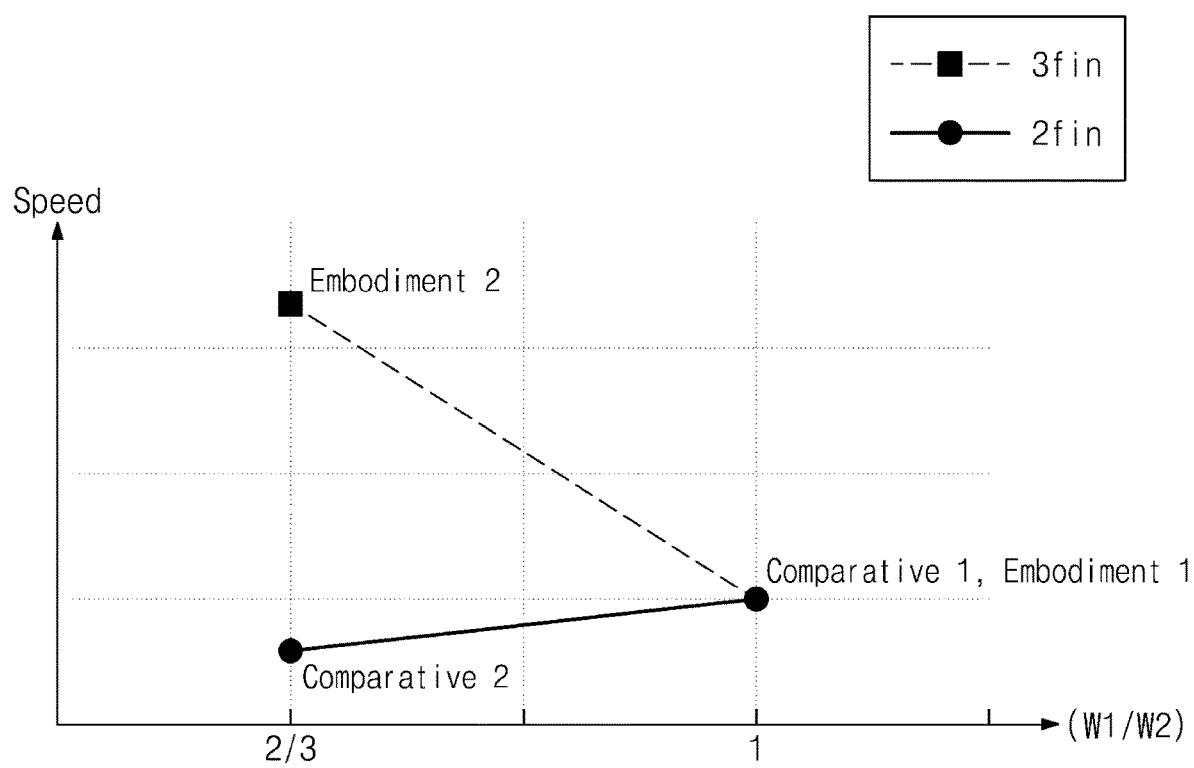
FIG. 5 illustrates a graph showing operating speeds of the semiconductor devices depicted in FIGS. 3A, 3B, 4A, and 4B.

FIGS. 3A and 3B illustrate cross-sectional views taken along line C-C' of FIG. 1, showing a semiconductor device according to comparative examples. FIGS. 4A and 4B illustrate cross-sectional views taken along line C-C' of FIG. 1, showing a semiconductor device according to some example embodiments of the present inventive concepts. FIG. 5 illustrates a graph showing operating speeds of the semiconductor devices depicted in FIGS. 3A, 3B, 4A, and 4B. Illustration of some components will be omitted for brevity of description.

Referring to FIGS. 3A, 3B, 4A, and 4B, a substrate 100 may include a PMOSFET region PR on which are provided first active patterns AP1, first source/drain patterns SD1, and first active contacts AC1, and also include an NMOSFET region NR on which are provided second active patterns AP2, second source/drain patterns SD2, and second active contacts AC2.

As for Comparative 1 of FIG. 3A, each of the first and second active patterns AP1 and AP2 includes two active fins, and a first width W1 or a maximum width in a first direction D1 of the first active contact AC1 is the same as a second width W2 or a maximum width in the first direction D1 of the second active contact AC2. As for Comparative 2 of FIG. 3B, each of the first and second active patterns AP1 and AP2 includes two active fins, and the first width W1 is about ⅔ of the second with W2.

As for Embodiment 1 of FIG. 4A, each of the first and second active patterns AP1 and AP2 includes three active fins, and the first and second width W1 and W2 are the same as each other. As for Embodiment 2 of FIG. 4B, each of the first and second active patterns AP1 and AP2 includes three active fins, and the first width W1 is about ⅔ of the second width W2.

Referring to FIG. 5, a semiconductor device operates at a speed lower in Comparative 2 (see FIG. 3B) than in Comparative 1 (see FIG. 3A). For example, when the first active pattern AP1 includes two active fins, the operating speed of the semiconductor device decreases as a value of W1/W2 becomes less than about 1. When the number of active fins is equal to or less than about two, a contact resistance increases due to a small size of the first active contact AC1, and thus it is difficult to counterbalance an increase in contact resistance by reducing a parasitic capacitance and a channel resistance, with the result that semiconductor devices decrease in operating speed.

Differently, it may be ascertained that a semiconductor device operates at a speed greater in Embodiment 2 (see FIG. 4B) than in Embodiment 1 (see FIG. 4A). For example, when the first active pattern AP1 includes three active fins, the operating speed of the semiconductor device increases as the value of W1/W2 becomes less than about 1. When the number of active fins is at least three, the reduction in both parasitic capacitance and channel resistance may counterbalance the increase in contact resistance. In such cases, a size of the first active contact AC1 may be adjusted to achieve a semiconductor device with optimized electrical characteristics.

Figure 9B:
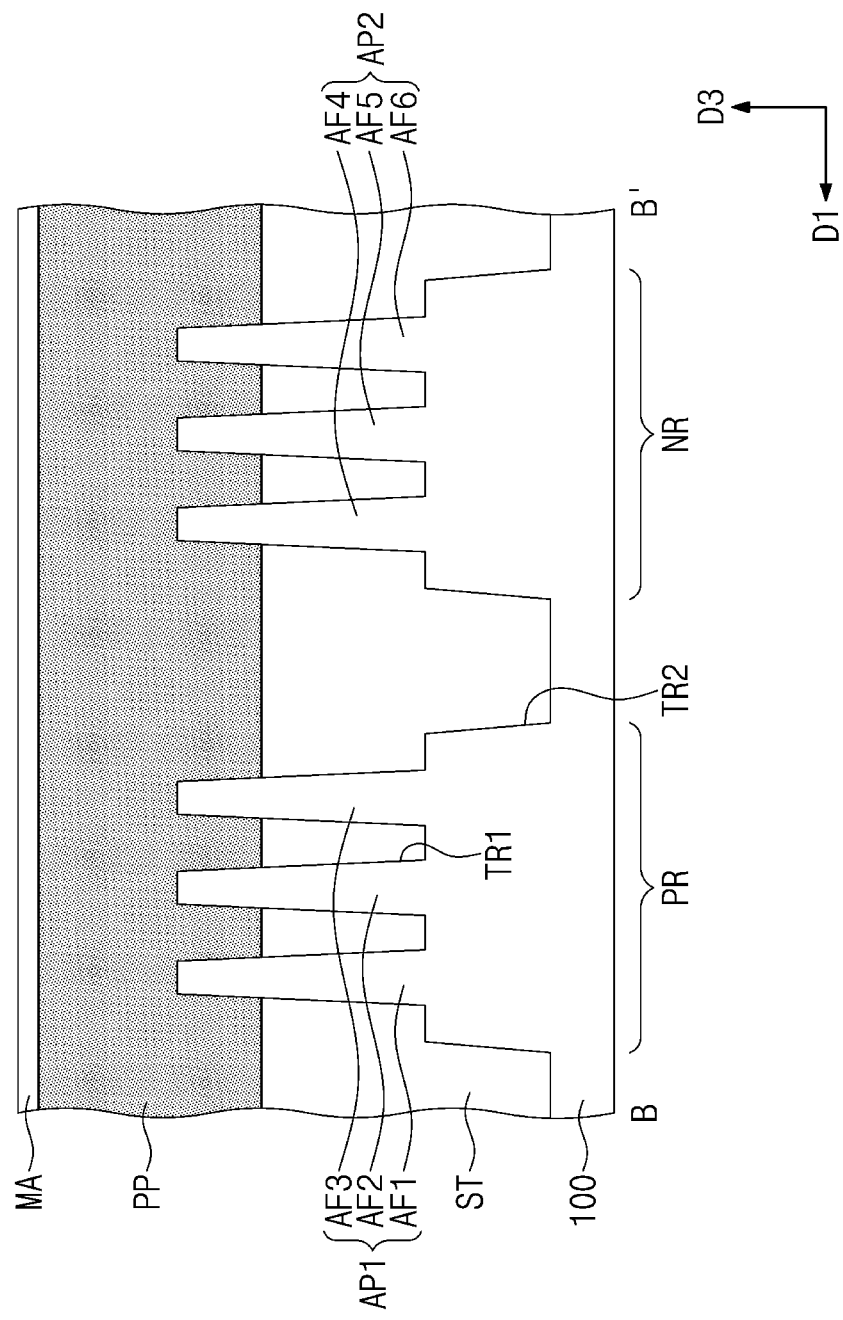
FIGS. 9B, 11B, and 13B illustrate cross-sectional views taken along line B-B' of FIGS. 8, 10, and 12, respectively.
Figure 10:
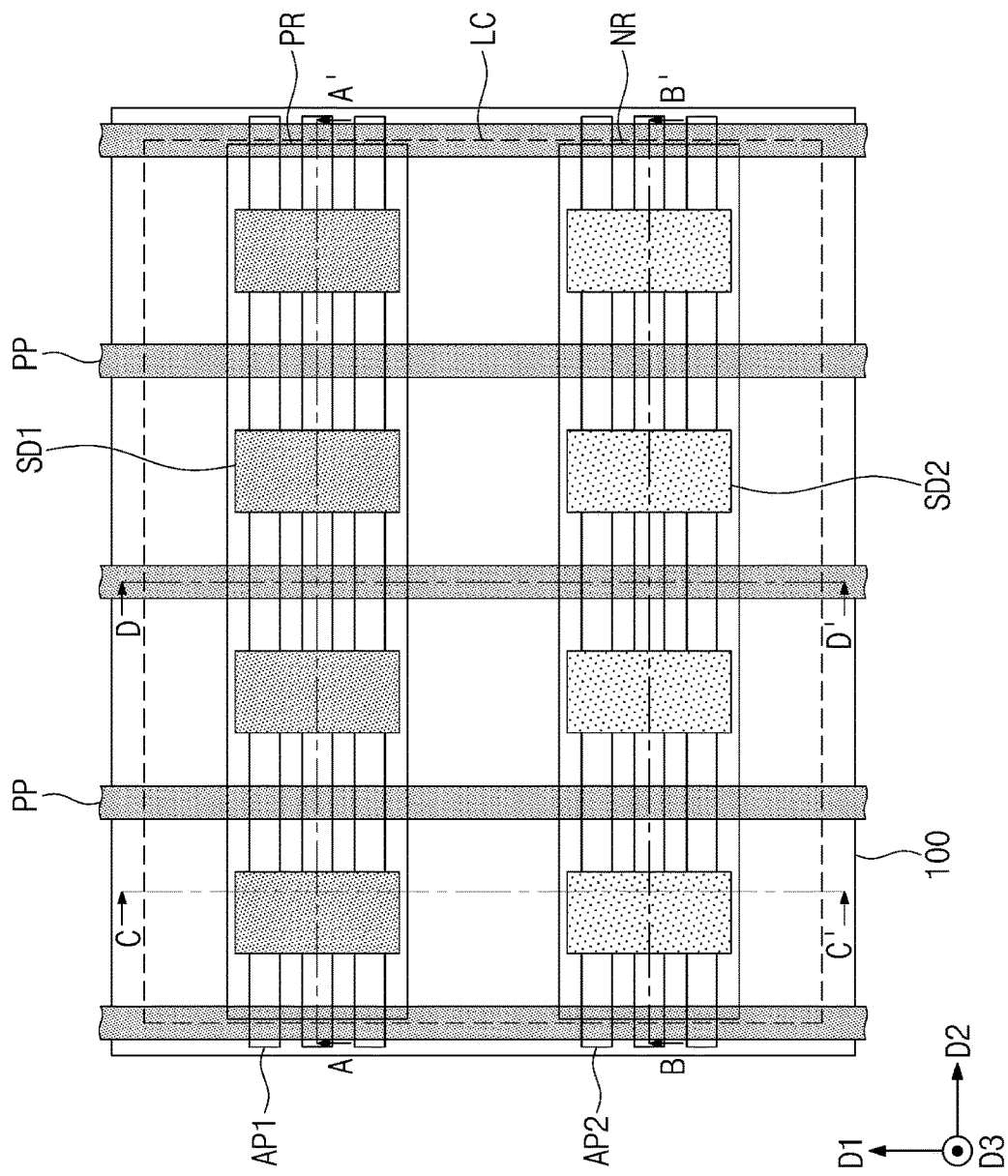
Figure 11A:
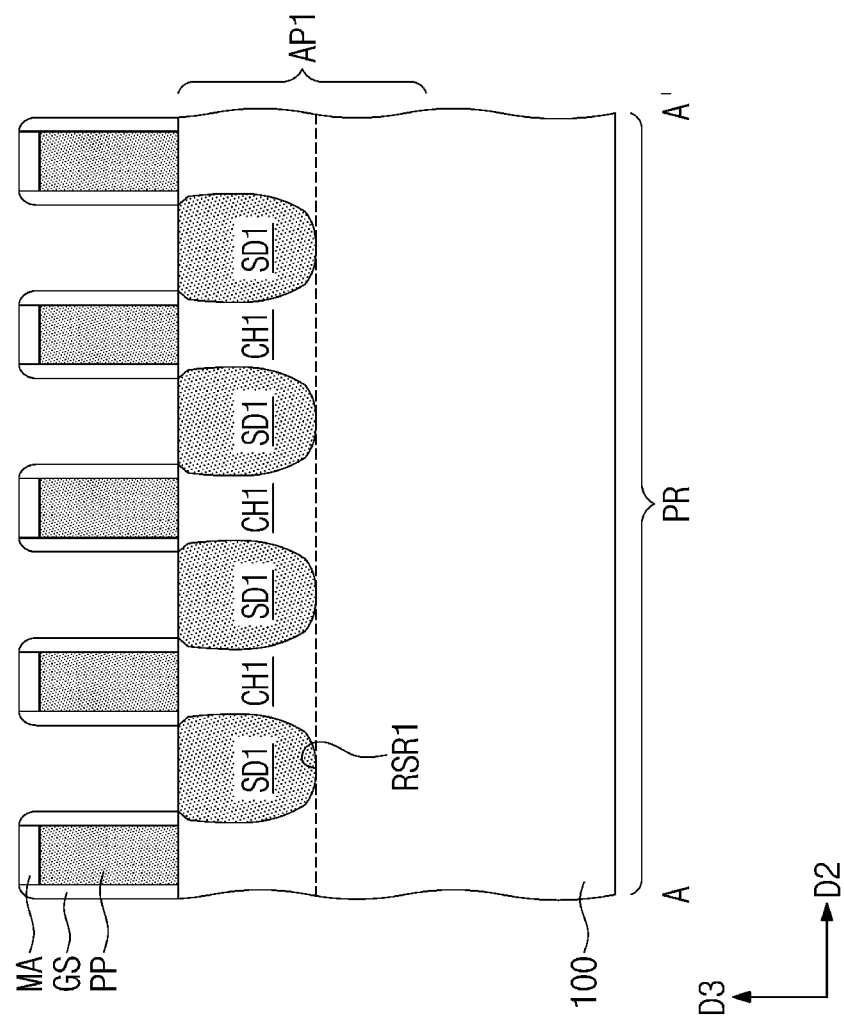
Figure 11B:
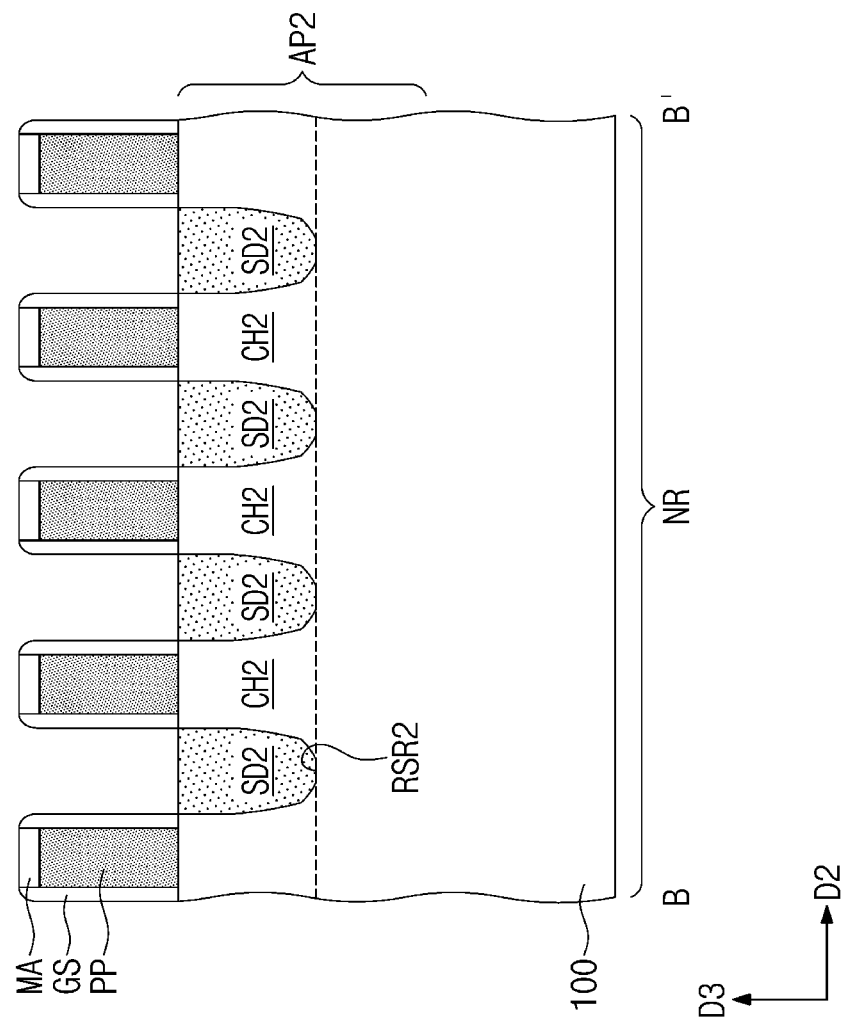
Figure 11C:
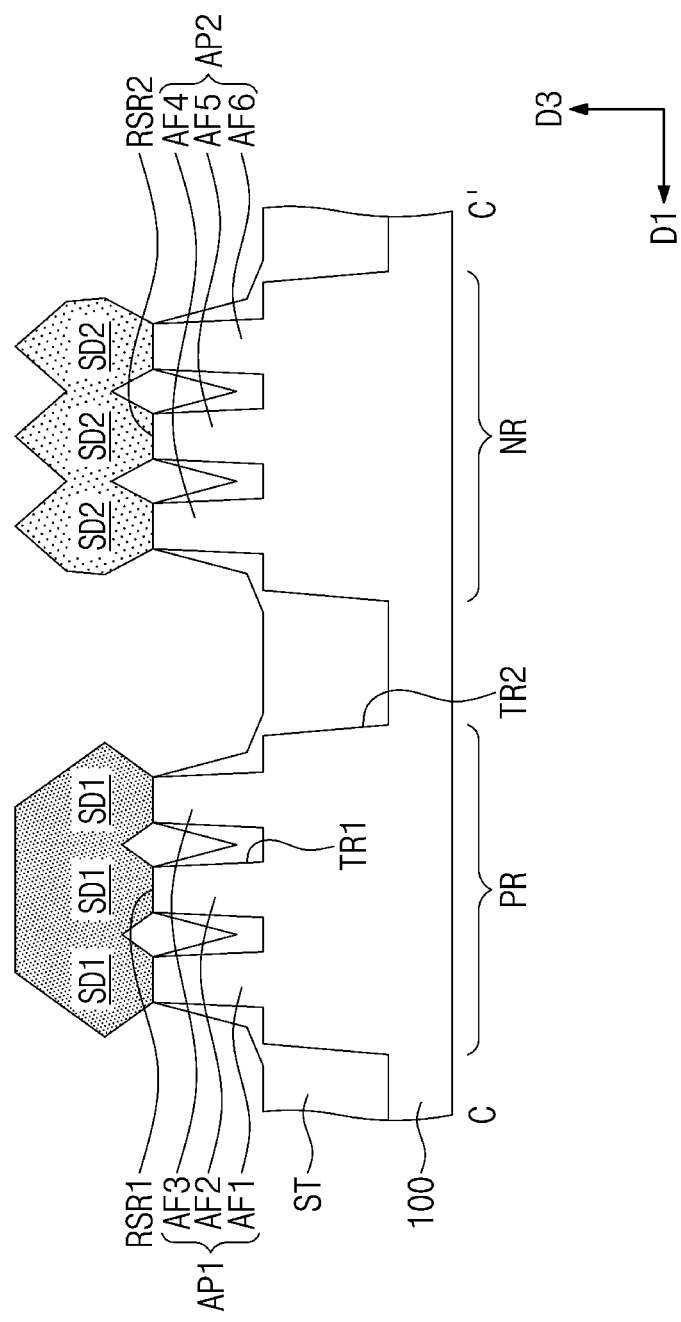
FIGS. 11C and 13C illustrate cross-sectional views taken along line C-C' of FIGS. 10 and 12, respectively.
Figure 11D:
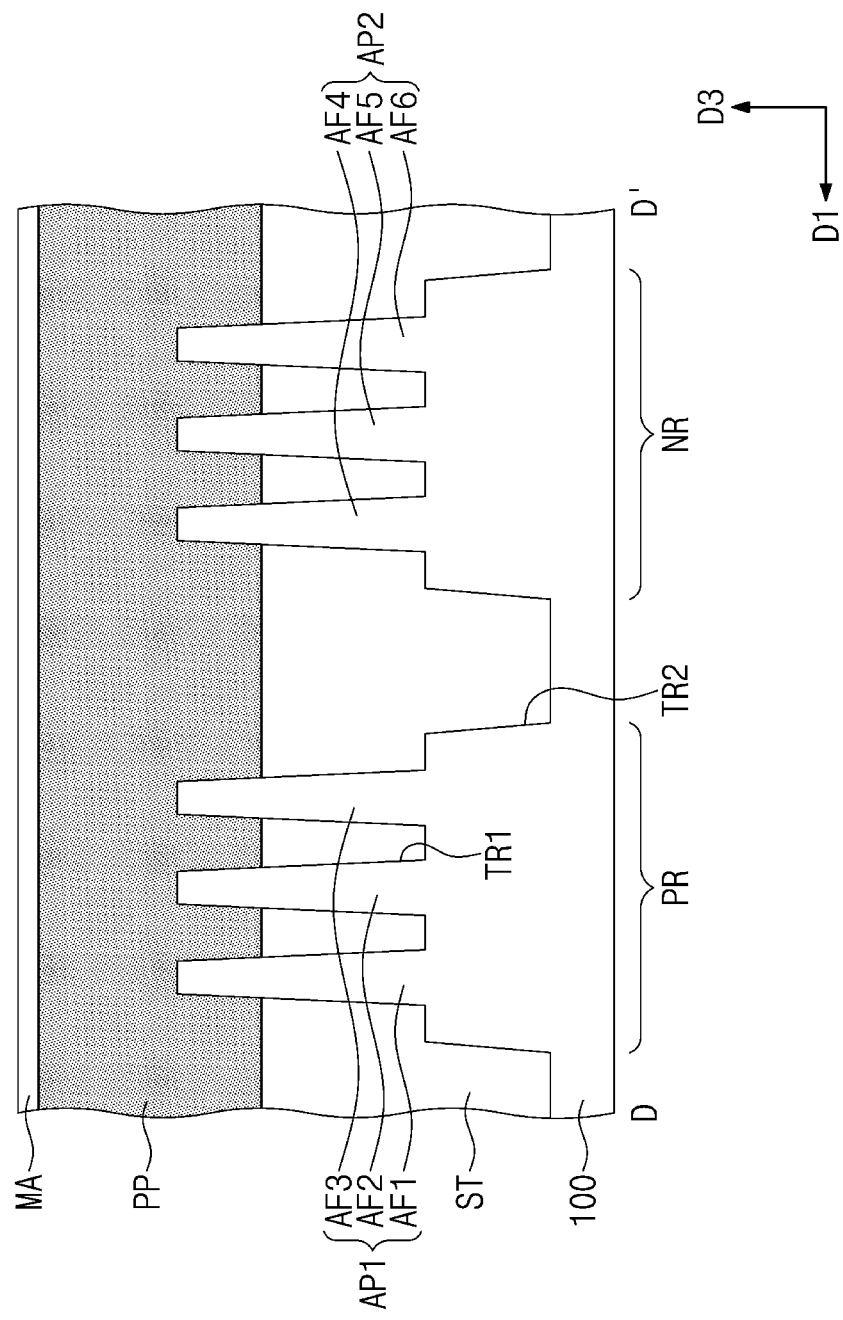
FIGS. 11D and 13D illustrate cross-sectional views taken along line D-D' of FIGS. 10 and 12, respectively.
Figure 12:
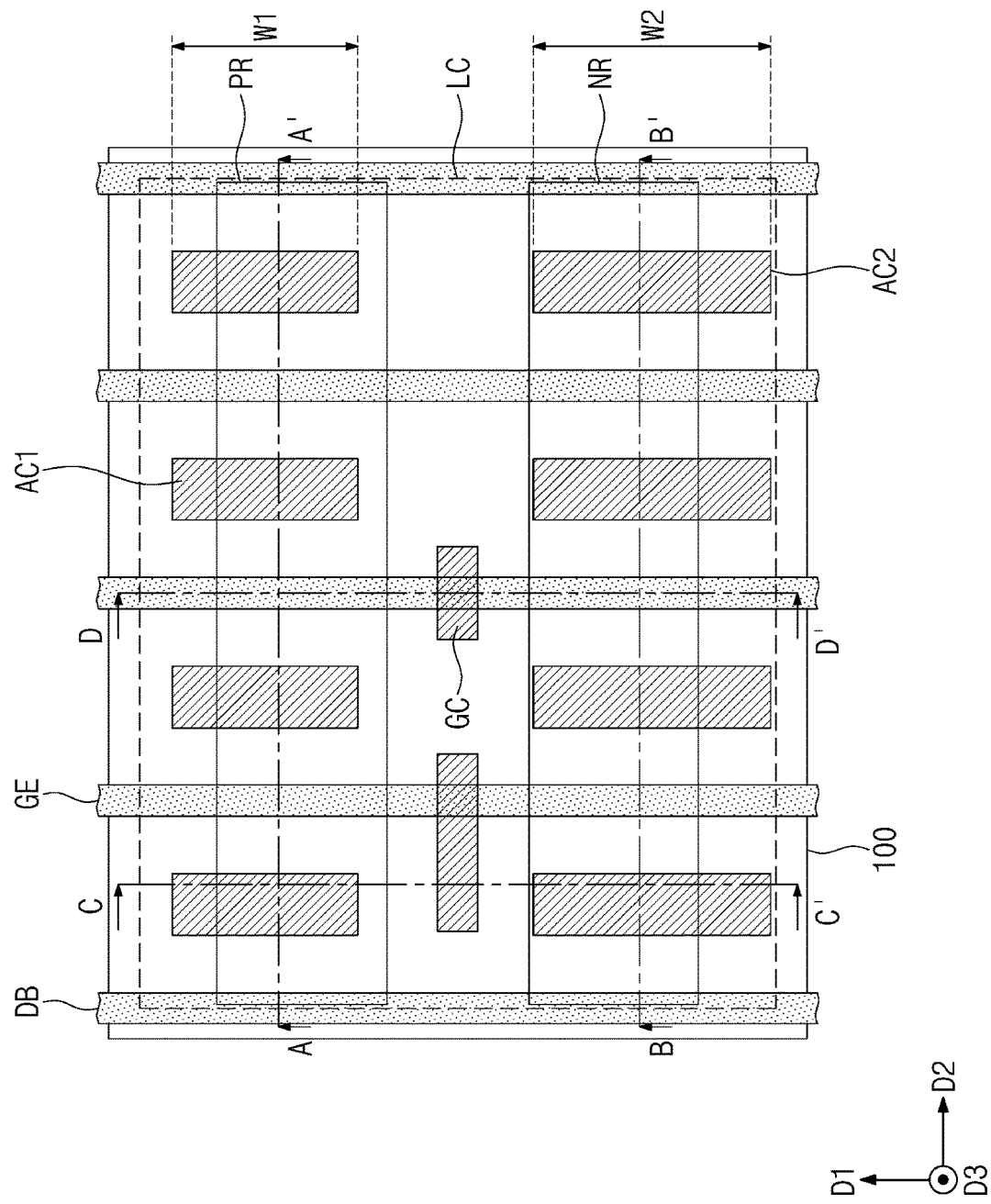
Figure 13A:
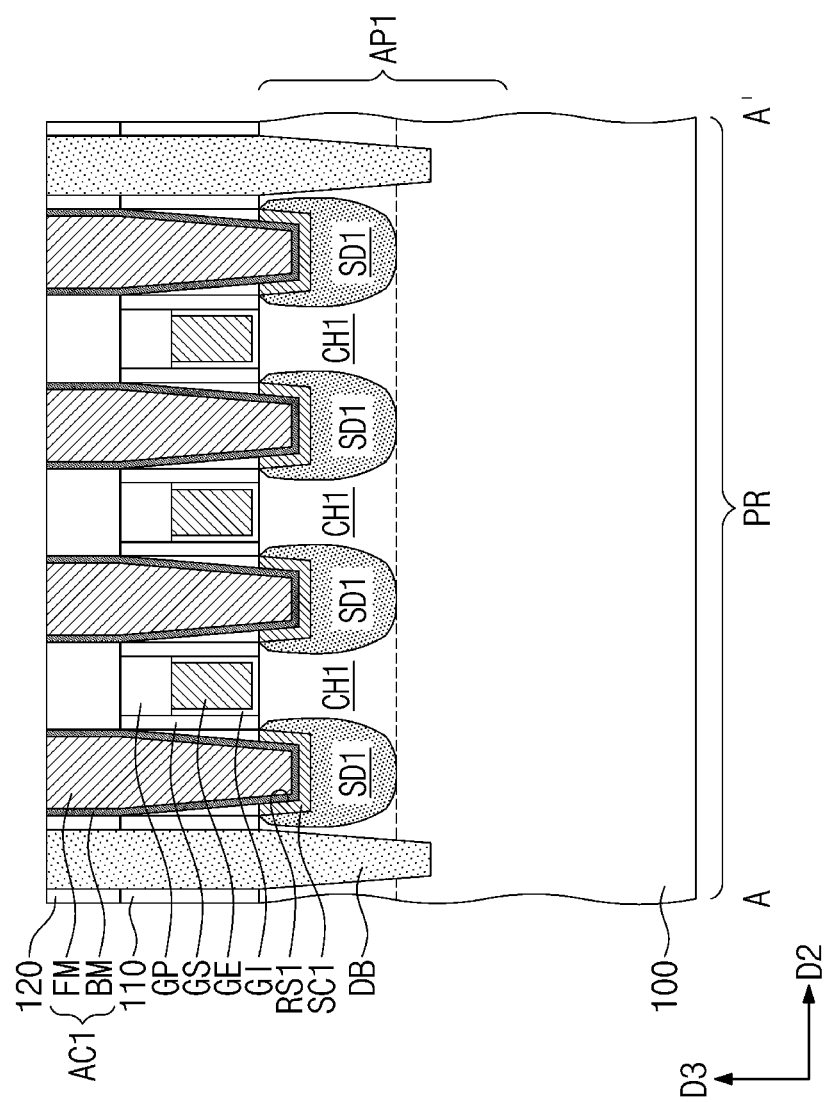
Figure 13B:
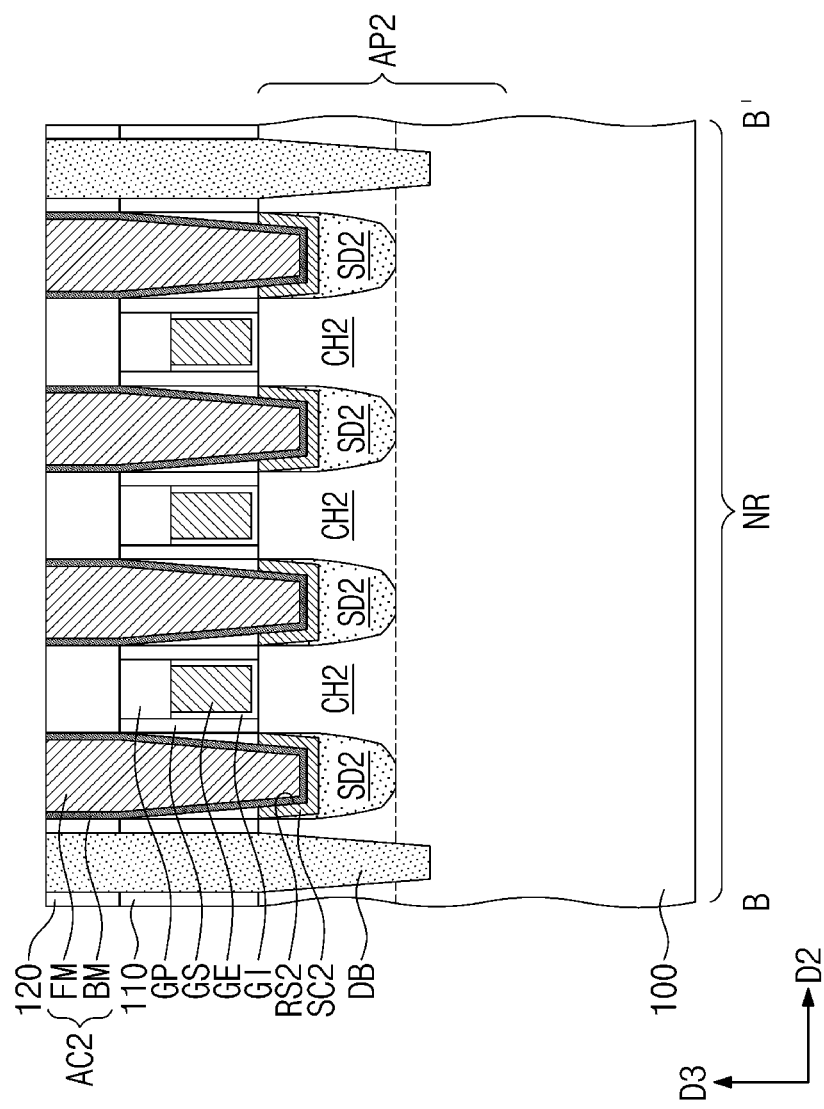
Figure 13C:
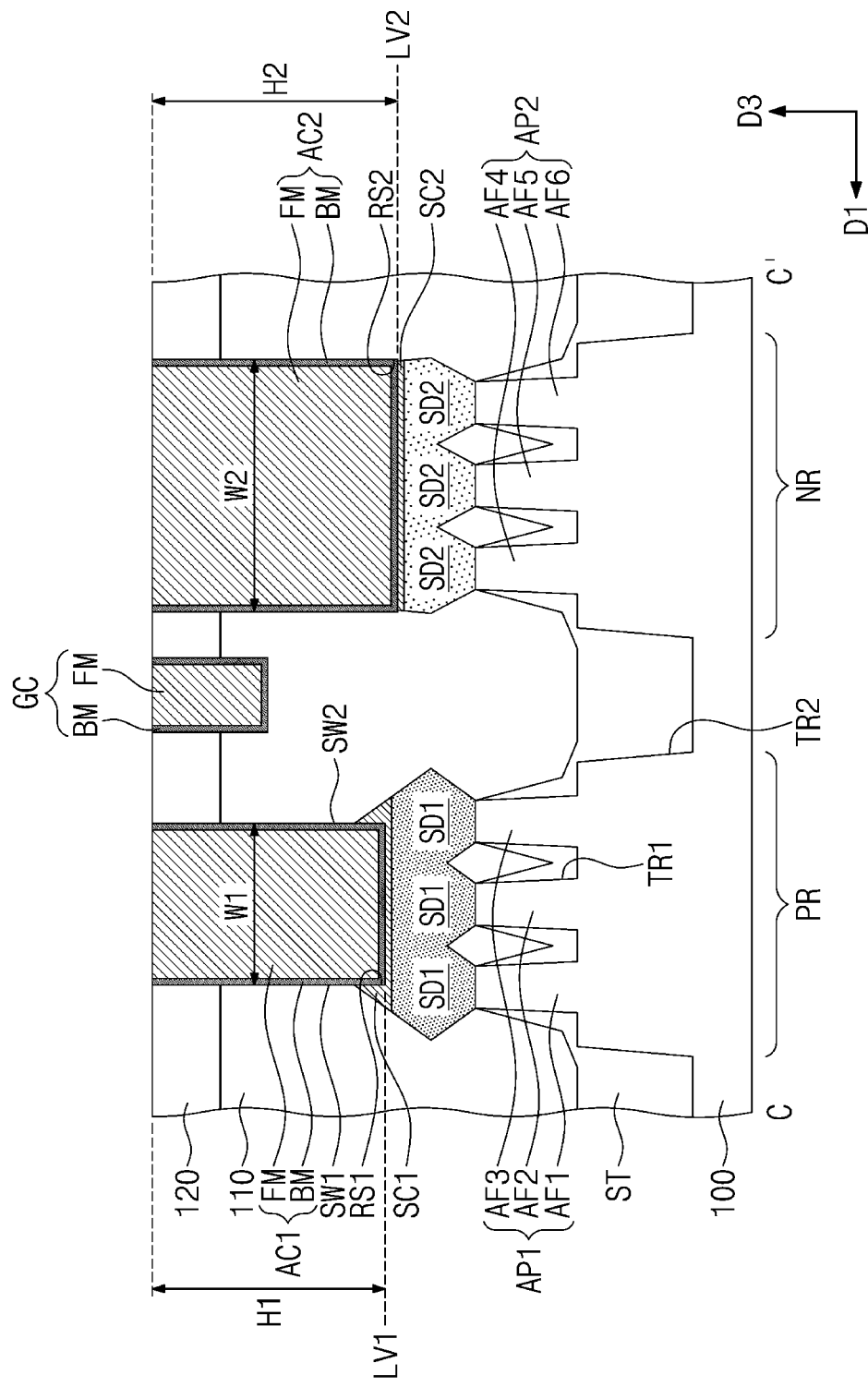
Figure 13D:
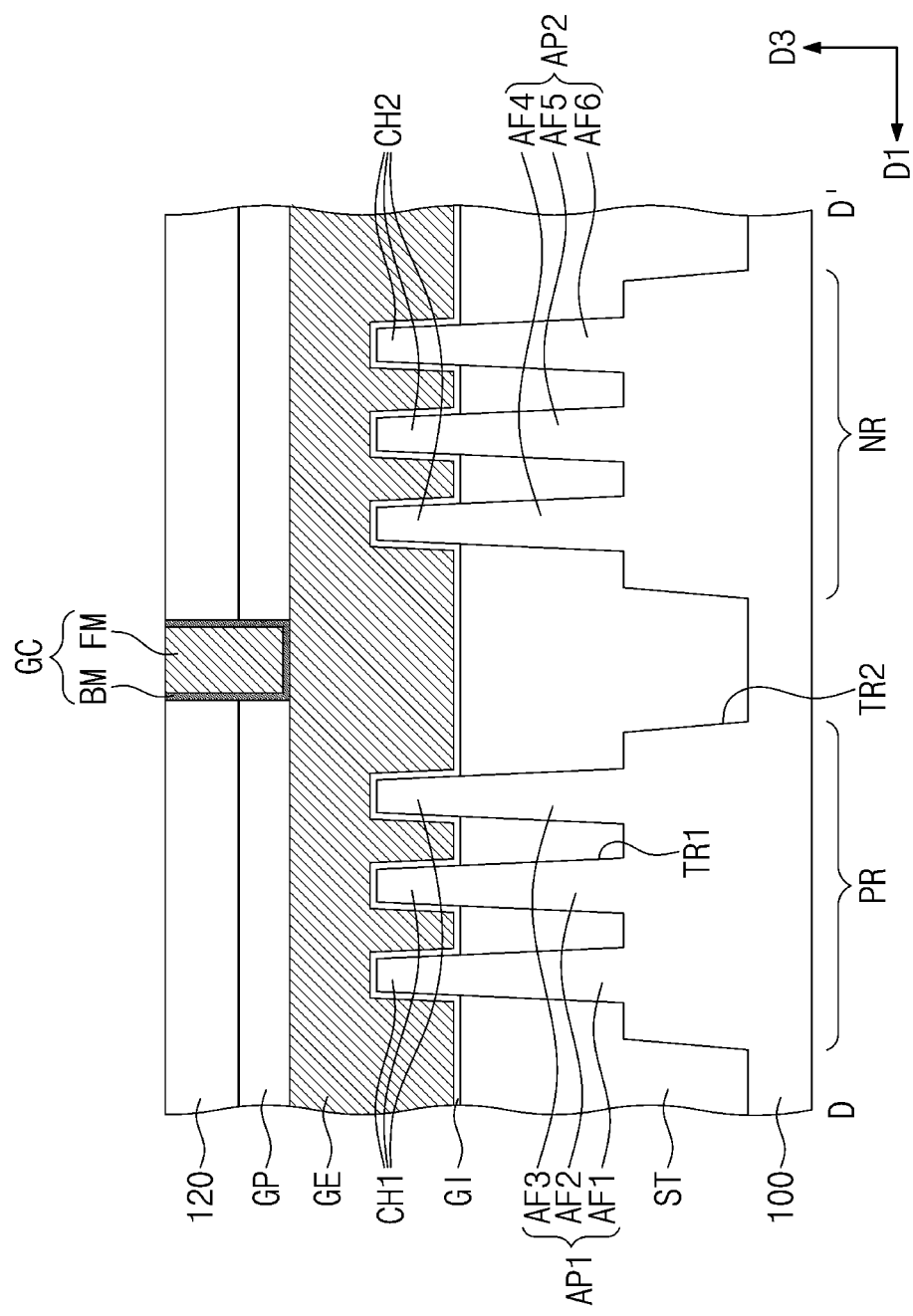

FIGS. 6, 8, 10, and 12 illustrate plan views showing a method of fabricating a semiconductor device according to some example embodiments of the present inventive concepts. FIGS. 7, 9A, 11A, and 13A illustrate cross-sectional views taken along line A-A' of FIGS. 6, 8, 10, and 12, respectively. FIGS. 9B, 11B, and 13B illustrate cross-sectional views taken along line B-B' of FIGS. 8, 10, and 12, respectively. FIGS. 11C and 13C illustrate cross-sectional views taken along line C-C' of FIGS. 10 and 12, respectively. FIGS. 11D and 13D illustrate cross-sectional views taken along line D-D' of FIGS. 10 and 12, respectively.

Figure 6:
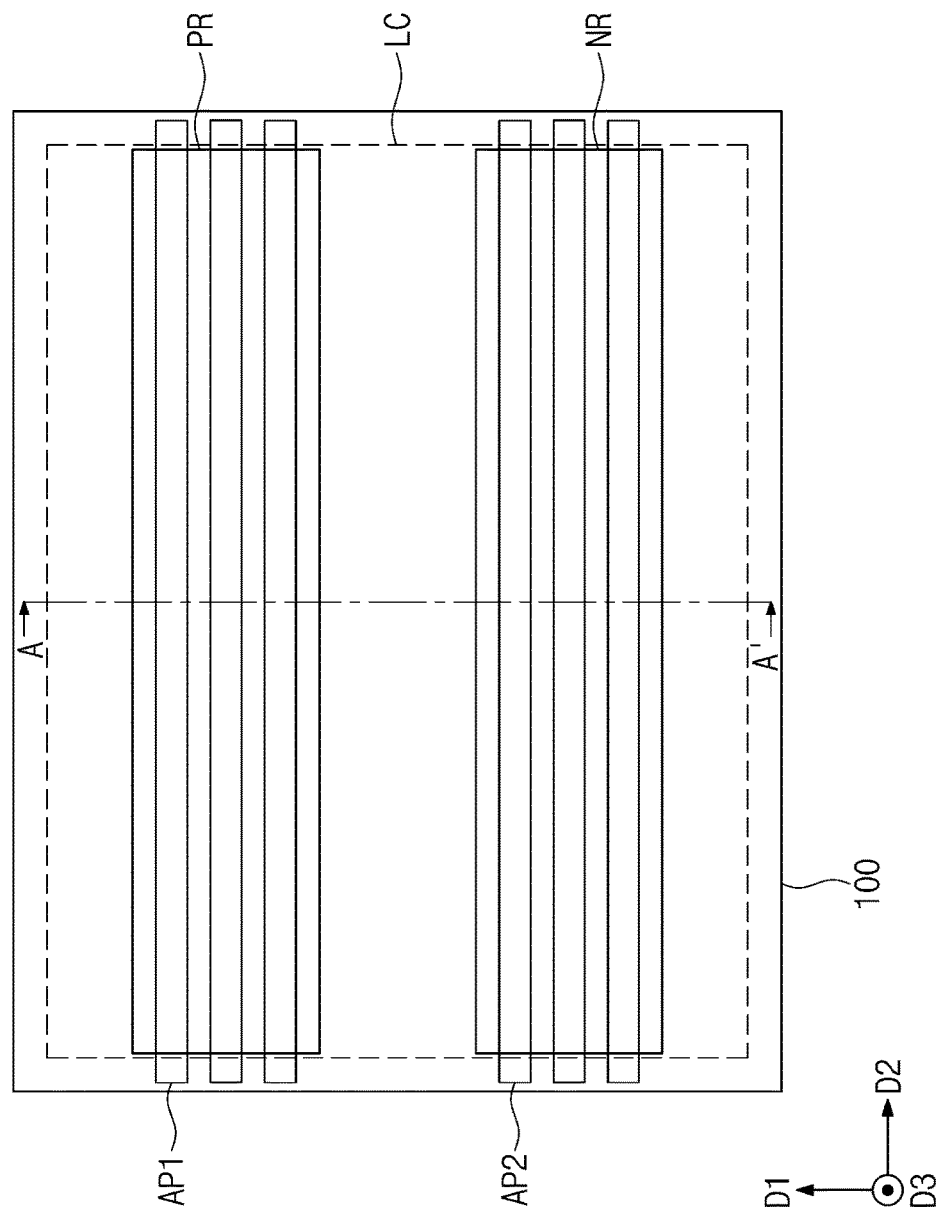
Figure 7:
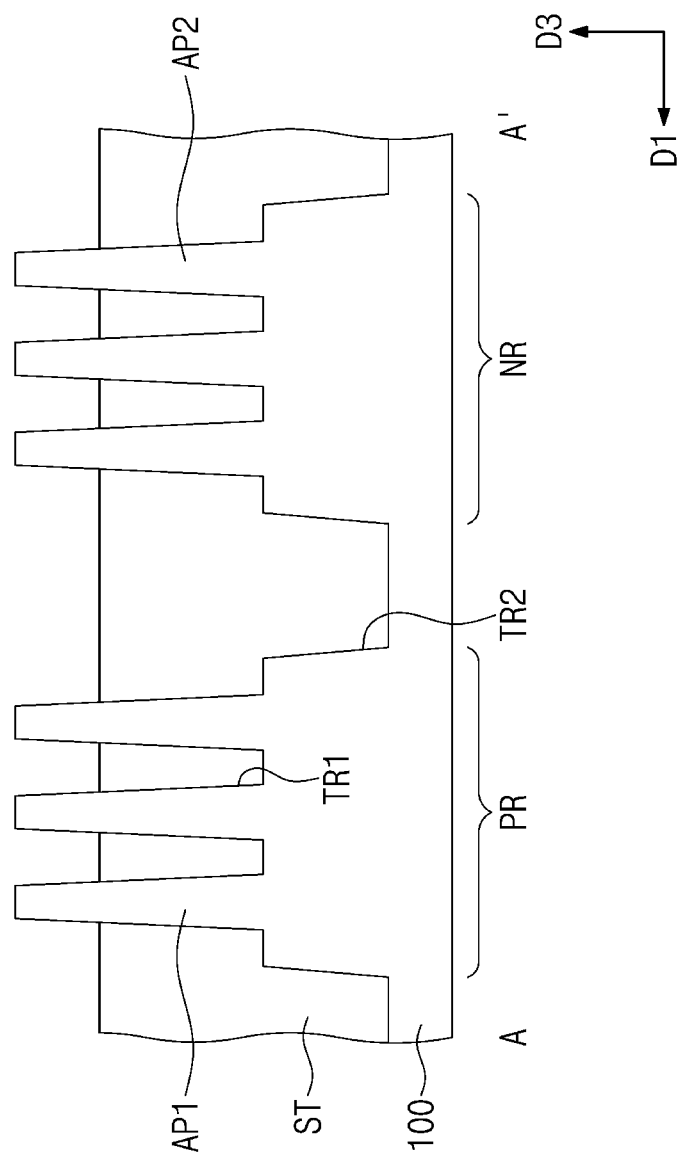

Referring to FIGS. 6 and 7, a substrate 100 may be provided to include a PMOSFET region PR and an NMOSFET region NR. The PMOSFET region PR and NMOSFET region NR may define a logic cell LC on the substrate 100.

The substrate 100 may be patterned to form first and second active patterns AP1 and AP2. The first active patterns AP1 may be formed on the PMOSFET region PR, and the second active patterns AP2 may be formed on the NMOSFET region NR. The first and second active patterns AP1 and AP2 may each include a plurality of active fins. For example, the first active pattern AP1 may include a first active fin AF1, a second active fin AF2, and a third active fin AF3, and the second active pattern AP2 may include a fourth active fin AF4, a fifth active fin AF5, and a sixth active fin AF6. The first active pattern AP1 may include at least three active fins.

A first trench TR1 may be formed between the first active patterns AP1 and between the second active patterns AP2. The substrate 100 may be patterned to form a second trench TR2 between the PMOSFET region PR and the NMOSFET region NR. The second trench TR2 may be formed deeper than the first trench TR1.

A device isolation layer ST may be formed on the substrate 100, filling the first and second trenches TR1 and TR2. The device isolation layer ST may include or may be a dielectric material, such as a silicon oxide layer. The device isolation layer ST may be recessed until upper portions of the first and second active patterns AP1 and AP2 are exposed. Thus, the upper portions of the first and second active patterns AP1 and AP2 may protrude upwards vertically from the device isolation layer ST.

Referring to FIGS. 8, 9A, and 9B, sacrificial patterns PP may be formed to run across the first and second active patterns AP1 and AP2. The sacrificial patterns PP may be formed to each have a linear or bar shape that extends in a first direction D1.

For example, the formation of the sacrificial patterns PP may include forming a sacrificial layer on an entire surface of the substrate 100, forming hardmask patterns MA on the sacrificial layer, and using the hardmask patterns MA as an etching mask to pattern the sacrificial layer. The sacrificial layer may include polysilicon.

A pair of gate spacers GS may be formed on opposite sidewalls of each of the sacrificial patterns PP. The formation of the gate spacers GS may include conformally forming a gate spacer layer on the entire surface of the substrate 100 and anisotropically etching the gate spacer layer. The gate spacer layer may include at least one selected from SiCN, SiCON, and SiN. Alternatively, the gate spacer layer may be a multi-layer including at least two selected from SiCN, SiCON, and SiN.

Referring to FIGS. 10 and 11A to 11D, first source/drain patterns SD1 may be formed on the upper portion of the first active pattern AP1. A pair of first source/drain patterns SD1 may be formed on opposite sides of each of the sacrificial patterns PP.

First recesses RSR1 may be formed by using the hardmask patterns MA and the gate spacers GS as an etching mask to etch the upper portion of the first active pattern AP1. While the upper portion of the first active pattern AP1 is etched, the device isolation layer ST may be recessed between the first active patterns AP1 (see FIG. 11C).

The first source/drain pattern SD1 may be formed by performing a selective epitaxial growth process in which an inner wall of the first recess RSR1 of the first active pattern AP1 is used as a seed layer. The formation of the first source/drain patterns SD1 may define a first channel pattern CH1 between a pair of first source/drain patterns SD1. For example, the selective epitaxial growth process may include a chemical vapor deposition (CVD) process or a molecular beam epitaxy (MBE) process. The first source/drain patterns SD1 may include a semiconductor element whose lattice constant is greater than that of a semiconductor element included in the substrate 100. For example, the first source/drain patterns SD1 may include or may be silicon-germanium (SiGe) and may provide the first channel pattern CH1 with compressive stress. Each of the first source/drain patterns SD1 may be formed of a plurality of semiconductor layers.

For example, impurities may be in-situ implanted during the selective epitaxial growth process for the formation of the first source/drain patterns SD1. For another example, after the first source/drain patterns SD1 are formed, impurities may be implanted into the first source/drain patterns SD1. The first source/drain patterns SD1 may be doped to have a first conductivity type (e.g., p-type).

Second source/drain patterns SD2 may be formed on the upper portion of the second active pattern AP2. A pair of second source/drain patterns SD2 may be formed on opposite sides of each of the sacrificial patterns PP.

For example, second recesses RSR2 may be formed by using the hardmask patterns MA and the gate spacers GS as an etching mask to etch the upper portion of the second active pattern AP2. The second source/drain pattern SD2 may be formed by performing a selective epitaxial growth process in which an inner wall of the second recess RSR2 of the second active pattern AP2 is used as a seed layer. The formation of the second source/drain patterns SD2 may define a second channel pattern CH2 between a pair of second source/drain patterns SD2. For example, the second source/drain patterns SD2 may include the same semiconductor element (e.g., Si) as that of the substrate 100. The second source/drain patterns SD2 may be doped to have a second conductivity type (e.g., n-type).

Different processes may be performed to sequentially form the first source/drain patterns SD1 and the second source/drain patterns SD2. For example, the first and second source/drain patterns SD1 and SD2 may not be formed at the same time.

Referring to FIGS. 12 and 13A to 13D, a first interlayer dielectric layer 110 may be formed to cover the first and second source/drain patterns SD1 and SD2, the hardmask patterns MA, and the gate spacers GS. For example, the first interlayer dielectric layer 110 may include a silicon oxide layer.

The first interlayer dielectric layer 110 may be planarized until top surfaces of the sacrificial patterns PP are exposed. An etch-back or chemical mechanical polishing (CMP) process may be used to planarize the first interlayer dielectric layer 110. The hardmask patterns MA may all be removed during the planarization process. As a result, the first interlayer dielectric layer 110 may have a top surface substantially coplanar with those of the sacrificial patterns PP and those of the gate spacers GS.

The sacrificial patterns PP may be replaced with corresponding gate electrodes GE. For example, the exposed sacrificial patterns PP may be selectively removed. The removal of the sacrificial patterns PP may form empty spaces. A gate dielectric pattern GI, the gate electrode GE, and a gate capping pattern GP may be formed in each of the empty spaces. The gate electrode GE may include a first metal pattern and a second metal pattern on the first metal pattern. The first metal pattern may be formed of a workfunction metal capable of controlling a threshold voltage of a transistor, and the second metal pattern may be formed of metal whose resistance is low.

A second interlayer dielectric layer 120 may be formed on the first interlayer dielectric layer 110. The second interlayer dielectric layer 120 may include a silicon oxide layer. First and second active contacts AC1 and AC2 may be formed to penetrate the second and first interlayer dielectric layers 120 and 110 and to respectively have electrical connections with the first and second source/drain patterns SD1 and SD2. The first active contact AC1 may be formed to have a maximum width or a first width W1 in the first direction D1, and the first width W1 may be less than a second width W2 or a maximum width in the first direction D1 of the second active contact AC2. A ratio of the first width W1 to the second width W2 may be greater than about 1:4. The first active contact AC1 may have a lowermost portion at a first level LV1, and the second active contact AC2 may have a lowermost portion at a second level LV2. The first level LV1 may be higher than the second level LV2. For example, the first and second active contacts AC1 and AC2 may have their top surfaces coplanar with each other, and the first active contact AC1 may be formed to have a vertical length H1 less than a vertical length H2 of the second active contact AC2.

The formation of the first and second active contacts AC1 and AC2 may include that the first and second source/drain patterns SD1 and SD2 are partially recessed to respectively form first and second recesses RS1 and RS2 in the first and second source patterns SD1 and SD2. The first and second active contacts AC1 and AC2 may be provided respectively in the first and second recesses RS1 and RS2 that are formed by recessing the first and second source/drain patterns SD1 and SD2. The first recess RS1 may have a volume less than that of the second recess RS2.

A gate contact GC may be formed to penetrate the second interlayer dielectric layer 120 and the gate capping pattern GP and to have an electrical connection with the gate electrode GE. For example, the gate contact GC may extend in a second direction D2, and may have a portion that is positioned between the first active contact AC1 and the second active contact AC2 and is spaced apart in the first direction D1 from the first and second active contacts AC1 and AC2.

A pair of separation structures DB may be formed on opposite sides of the logic cell LC, with opposite sides of the separation structures DB facing each other in the second direction D2. The separation structures DB may be formed to overlap the gate electrodes GE formed on the opposite sides of the logic cell LC. For example, the formation of the separation structures DB may include forming holes to penetrate the first and second interlayer dielectric layers 110 and 120 and to extend into the first and second active patterns AP1 and AP2, and then filling the holes with a dielectric layer.

Referring back to FIGS. 1 and 2A to 2D, a second interlayer dielectric layer 120 may be formed on the first interlayer dielectric layer 110. A first metal layer M1 may be formed in the third interlayer dielectric layer 130. The formation of the first metal layer M1 may include forming first lower wiring lines LIL1, second lower wiring lines LIL2, and lower vias VI.

A fourth interlayer dielectric layer 140 may be formed on the third interlayer dielectric layer 130. A second metal layer M2 may be formed in the fourth interlayer dielectric layer 140. The formation of the second metal layer M2 may include forming upper wiring lines UIL. The upper wiring lines UIL may be formed by a dual damascene process.

In a semiconductor device according to the present inventive concepts, because an active contact provided on a PMOSFET region has a size less than that of an active contact provided on an NMOSFET region, it may be possible to provide the PMOSFET region with high stress and to decrease a parasitic capacitance, which may result in an increase in performance of the semiconductor device.

Although the present inventive concepts have been described in connection with example embodiments of the present inventive concepts illustrated in the accompanying drawings, it will be understood by one of ordinary skill in the art that variations in form and detail may be made therein without departing from the spirit and essential features of the present inventive concepts. The above disclosed embodiments should thus be considered illustrative and not restrictive.

What is claimed is:

1. A semiconductor device, comprising:
a substrate that includes a PMOSFET region and an NMOSFET region;
a plurality of first active fins at the PMOSFET region;
a plurality of second active fins at the NMOSFET region;
a gate electrode that extends in a first direction and runs across the first active fins and the second active fins;
a first source/drain pattern on the first active fins, the first source/drain pattern connecting the first active fins to each other;
a second source/drain pattern on the second active fins, the second source/drain pattern connecting the second active fins to each other;
a first active contact electrically connected to the first source/drain pattern; and
a second active contact electrically connected to the second source/drain pattern,
wherein a maximum width of the first active contact in the first direction is less than a maximum width of the second active contact in the first direction,
wherein the first active contact is in a region where the first source/drain pattern is recessed,
wherein the second active contact is in a region where the second source/drain pattern is recessed, and
wherein a volume of the region where the first source/drain pattern is recessed is less than a volume of the region where the second source/drain pattern is recessed.

2. The semiconductor device of claim 1, wherein a ratio of the maximum width of the first active contact in the first direction to the maximum width of the second active contact in the first direction is greater than about 1:4.

3. The semiconductor device of claim 1, wherein the number of the first active fins is at least three.

4. The semiconductor device of claim 1, wherein the first source/drain pattern includes silicon-germanium (SiGe).

5. The semiconductor device of claim 1, wherein a bottom surface of the first active contact is at a level higher in a direction perpendicular to the substrate than a level of a bottom surface of the second active contact.

6. The semiconductor device of claim 1, wherein a vertical length of the first active contact is less than a vertical length of the second active contact in a direction perpendicular to the substrate.

7. The semiconductor device of claim 1, further comprising:
a gate contact electrically connected to the gate electrode,
wherein the gate contact extends in a second direction that intersects the first direction, and
wherein, when viewed in plan view, a portion of the gate contact is between the first active contact and the second active contact and is spaced apart in the first direction from the first active contact and the second active contact.

8. The semiconductor device of claim 1, further comprising:
  a first silicide pattern between the first source/drain pattern and the first active contact; and
  a second silicide pattern between the second source/drain pattern and the second active contact.

9. The semiconductor device of claim 8, wherein
  the first active contact has a first sidewall and a second sidewall that face each other in the first direction, and
  a portion of the first silicide pattern is in contact with one or both of the first and second sidewalls of the first active contact.

10. A semiconductor device, comprising:
  a PMOSFET region and an NMOSFET region that are spaced apart from each other in a first direction on a substrate;
  a first active pattern and a second active pattern that are respectively provided on the PMOSFET region and the NMOSFET region;
  a first source/drain pattern and a second source/drain pattern that are respectively provided on the first active pattern and the second active pattern; and
  a first active contact and a second active contact that are respectively electrically connected to the first source/drain pattern and the second source/drain pattern,
  wherein a maximum width of the first active contact in the first direction is less than a maximum width of the second active contact in the first direction,
  wherein a ratio of the maximum width of the first active contact in the first direction to the maximum width of the second active contact in the first direction is greater than about 1:4,
  wherein a lowermost portion of the first active contact is located at a first level,
  wherein a lowermost portion of the second active contact is located at a second level,
  wherein the first level is higher than the second level in a direction perpendicular to the substrate,
  wherein the first active contact is provided in a region where the first source/drain pattern is recessed,
  wherein the second active contact is provided in a region where the second source/drain pattern is recessed, and
  wherein a volume of the region where the first source/drain pattern is recessed is less than a volume of the region where the second source/drain pattern is recessed.

11. The semiconductor device of claim 10, further comprising:
  a gate electrode that extends across the first and second active patterns in the first direction; and
  a gate contact electrically connected to the gate electrode,
  wherein the gate contact extends in a second direction that intersects the first direction, and
  wherein, when viewed in plan view, a portion of the gate contact is positioned between the first active contact and the second active contact and is spaced apart in the first direction from the first active contact and the second active contact.

12. The semiconductor device of claim 10, wherein the first source/drain pattern includes silicon-germanium (SiGe).

13. The semiconductor device of claim 10, wherein the first active pattern includes a first active fin, a second active fin, and a third active fin that are arranged along the first direction.

14. The semiconductor device of claim 10, wherein
  a top surface of the first active contact is coplanar with a top surface of the second active contact, and
  a vertical length of the first active contact is less than a vertical length of the second active contact in a direction perpendicular to the substrate.

15. The semiconductor device of claim 10, further comprising:
  a first silicide pattern between the first active contact and the first source/drain pattern,
  wherein a portion of the first silicide pattern is in contact with one or both of two sidewalls of the first active contact, the two sidewalls facing each other in the first direction.

16. A semiconductor device, comprising:
  a logic cell on a substrate, the logic cell including a PMOSFET region and an NMOSFET region that are spaced apart from each other in a first direction;
  a device isolation layer that defines a plurality of first active fins at the PMOSFET region and a plurality of second active fins at the NMOSFET region, the first and second active fins extending in a second direction that intersects the first direction;
  a first source/drain pattern on the first active fins, the first source/drain pattern connecting the first active fins to each other;
  a second source/drain pattern on the second active fins, the second source/drain pattern connecting the second active fins to each other;
  a gate electrode that extends in the first direction and extends across the first active fins and the second active fins;
  a gate spacer on opposite sides of the gate electrode, the gate spacer extending in the first direction;
  a gate dielectric pattern between the gate electrode and the first active fin, between the gate electrode and the second active fin, and between the gate electrode and the gate spacer;
  a gate capping pattern on a top surface of the gate electrode, the gate capping pattern extending in the first direction;
  an interlayer dielectric layer on the gate electrode, the first source/drain pattern, and the second source/drain pattern;
  a gate contact in the interlayer dielectric layer and electrically connected to the gate electrode;
  a first active contact and a second active contact that are disposed in the interlayer dielectric layer and are respectively electrically connected to the first source/drain pattern and the second source/drain pattern; and
  a first silicide pattern and a second silicide pattern, the first silicide pattern being provided between the first active contact and the first source/drain pattern, and the second silicide pattern being provided between the second active contact and the second source/drain pattern,
  wherein the number of the first active fins is at least three,
  wherein a maximum width of the first active contact in the first direction is less than a maximum width of the second active contact in the first direction,
  wherein a ratio of the maximum width of the first active contact in the first direction to the maximum width of the second active contact in the first direction is greater than about 1:4,
  wherein the first active contact is provided in a region where the first source/drain pattern is recessed,
  wherein the second active contact is provided in a region where the second source/drain pattern is recessed, and wherein a volume of the region where the first source/drain pattern is recessed is less than a volume of the region where the second source/drain pattern is recessed.

17. The semiconductor device of claim 16, wherein a vertical length of the first active contact is less than a vertical length of the second active contact, a bottom surface of the first active contact is located at a first level, a bottom surface of the second active contact is located at a second level, and the first level is higher than the second level in a direction perpendicular to the substrate.

18. The semiconductor device of claim 16, wherein the first active contact has a first sidewall and a second sidewall that face each other in the first direction, and a portion of the first silicide pattern is in contact with one or both of the first sidewall and the second sidewall.

19. The semiconductor device of claim 16, wherein the first source/drain pattern includes silicon-germanium (SiGe).

\* \* \* \* \*